(12) United States Patent
Sakaki

(10) Patent No.: US 7,420,821 B2
(45) Date of Patent: Sep. 2, 2008

(54) ELECTRONIC MODULE AND DRIVING CIRCUIT BOARD THEREFOR

(75) Inventor: Yoichiro Sakaki, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 1302 days.

(21) Appl. No.: 10/652,166

(22) Filed: Sep. 2, 2003

(65) Prior Publication Data

US 2004/0169645 A1 Sep. 2, 2004

(30) Foreign Application Priority Data

Sep. 3, 2002 (JP) ............................. 2002-258123
Aug. 26, 2003 (JP) ............................. 2003-301623

(51) Int. Cl.
H05K 1/11 (2006.01)
(52) U.S. Cl. ...................... 361/803; 349/149
(58) Field of Classification Search ............... 174/259, 174/260; 361/803, 760; 349/149
See application file for complete search history.

(56) References Cited

U.S. PATENT DOCUMENTS

| | | | |
|---|---|---|---|
| 5,402,255 A | 3/1995 | Nakanishi et al. | |
| 5,592,199 A | 1/1997 | Kawaguchi et al. | |
| 5,670,994 A | 9/1997 | Kawaguchi et al. | |
| RE38,516 E * | 5/2004 | Hasegawa et al. | 349/58 |
| 7,034,810 B2 * | 4/2006 | Goto et al. | 345/204 |
| 2005/0128416 A1 * | 6/2005 | Hashimoto | 349/149 |
| 2006/0146263 A1 * | 7/2006 | Park et al. | 349/149 |
| 2006/0176436 A1 * | 8/2006 | Deane | 349/149 |
| 2007/0076159 A1 * | 4/2007 | Lee et al. | 349/149 |

FOREIGN PATENT DOCUMENTS

| | | |
|---|---|---|
| JP | 5-20034 | 3/1993 |
| JP | 6-3684 | 1/1994 |
| JP | 7-49657 | 2/1995 |
| JP | 10-319876 | 4/1998 |
| JP | 2000-131673 | 5/2000 |
| JP | 2000-137445 | 5/2000 |
| JP | 2000-236148 | 8/2000 |

OTHER PUBLICATIONS

U.S. Appl. No. 09/669,688, filed Sep. 25, 2003, currently pending; for: "Electronic Module and Method for Fabricating the Same"; Applicant: Yoichiro Sakaki.
U.S. Appl. No. 09/688,684, filed Oct. 17, 2000, currently pending; for: "Liquid Crystal Display Device"; Applicants: Katsunori Nagata et al.

* cited by examiner

Primary Examiner—Tuan Dinh
Assistant Examiner—Yuriy Semenenko
(74) Attorney, Agent, or Firm—Keating & Bennett, LLP

(57) ABSTRACT

An electronic module includes an electronic circuit substrate, and a plurality of driving circuit boards attached to a terminal region of the electronic circuit substrate while being arranged adjacent to one another in the x direction. The driving circuit boards are electrically connected to one another. Adjacent driving circuit boards are electrically connected to each other by only substrate terminals provided on the electronic circuit substrate, with the connection resistance therebetween being about 10 Ω or less.

77 Claims, 19 Drawing Sheets

ELECTRONIC MODULE AND DRIVING CIRCUIT BOARD THEREFOR

FIELD OF THE INVENTION

The present invention relates to an electronic module and a driving circuit board therefor.

BACKGROUND OF THE INVENTION

In a liquid crystal display device, or the like, the display panel and the driving circuits (drivers) for driving the display panel are typically connected to each other using a conventional TCP (Tape Carrier Package)-based structure.

FIG. 1 is a diagram schematically illustrating the structure of a liquid crystal module using the conventional TCP-based structure. In the module structure of FIG. 1, a plurality of gate TCPs 12 and a plurality of source TCPs 14 are connected to a gate terminal region and a source terminal region, respectively, of a display panel 11 via an anisotropic conductive film (hereinafter referred to as "ACF"). A gate PWB (Printed Wire Board) 13 and a source PWB 15 are connected to the gate TCPs 12 and the source TCPs 14, respectively, via ACF. The gate PWB 13 and the source PWB 15 are each connected to an FPC 16, which is connected to an external circuit board.

Although this TCP-based module structure has long been used in mass production, it requires a large number of components, and the material cost and the assembly cost are high. In view of this, a PWB-free structure as illustrated in FIG. 2 has been researched in the art.

A PWB-free module structure does not include PWBs as described above. In the PWB-free structure illustrated in FIG. 2, a plurality of gate TCPs 22 and a plurality of source TCPs 23 are connected to a gate terminal region and a source terminal region, respectively, of a display panel 21, and an FPC 24 is connected to the source terminal region. The FPC 24 is connected to an external circuit board, from which a gate driving power supply/signal and a source driving power supply/signal are supplied.

The gate driving power supply/signal received through the FPC 24 is transmitted successively through the gate TCPs 22 via a panel line 27 provided on the display panel 21. Similarly, the source driving power supply/signal received through the FPC 24 is transmitted successively through the source TCPs 23 via the panel line 27 provided on the display panel 21.

Next, a conventional PWB-free connection structure will be described with reference to FIG. 4 and FIG. 5. In the following description, the direction in which a plurality of TCPs are arranged in the source terminal region of the display panel 21 will be referred to as the "x direction", and a direction which crosses (typically substantially perpendicular to) the x direction will be referred to as the "y direction". Moreover, referring to FIG. 3, a direction 4 that is perpendicular to a side surface 3 of a substrate 2 including an edge of the substrate 2 along which a terminal 1 at one end of a line 6 is located will be referred to herein as the "terminal termination direction". Where a plurality of terminals 1 are provided, a direction 5 in which the terminals 1 are arranged will be referred to as the "terminal arrangement direction".

FIG. 4 is an enlarged view of a broken line section in FIG. 2, illustrating a portion of a liquid crystal module structure disclosed in Japanese Laid-Open Patent Publication No. 7-049657 (FIG. 3). As illustrated in FIG. 4, a driving circuit 35 is mounted on each TCP 23, and the driving circuit 35 includes input terminals 54 and output terminals 55. The TCP 23 further includes first terminals 31, second terminals 32, third terminals 33 and TCP lines 34. The TCP lines 34 are connected to the first terminals 31 and the third terminals 33.

In the TCP 23, the source driving power supply/signal is supplied from the first terminals 31 to the lines 34 and output from the third terminals 33. The source driving power supply/signal output from the third terminals 33 is input to the first terminals 31 of the next TCP 23 via panel lines 27a and panel terminals 27b, which are formed on the display panel. Thus, adjacent TCPs 23 are electrically connected to each other via the panel lines 27a and the panel terminals 27b, which are formed on the display panel.

The source driving power supply/signal supplied to the lines 34 is input to the driving circuit 35 via the input terminals 54. The signal is output from the driving circuit 35 through the output terminals 55 and is supplied to other lines (not shown) on the display panel such as source lines or gate lines via the second terminals 32 of the TCP 23.

Next, the first terminals 31 and the third terminals 33 will be described in greater detail.

As described above, adjacent TCPs 23 are electrically connected to each other via the panel lines 27a and the panel terminals 27b, which are formed on the display panel. The panel lines 27a and the panel terminals 27b electrically connect the first terminals 31 of the TCP 23 with the third terminals 33.

As illustrated in FIG. 4, some terminals 31a among the plurality of the first terminals 31 are arranged in the y direction, and the terminal termination direction thereof is the −x direction. Similarly, some terminals 33a among the plurality of third terminals 33 are arranged in the y direction, and the terminal termination direction thereof is the x direction. The terminals 31a and the terminals 33a are facing each other with a small interval therebetween, and therefore are connected to each other via the panel terminals 27b formed on the display panel. The other terminals 31b of the first terminals 31 and the other terminals 33b of the third terminals 33 are arranged in the x direction, and the terminal termination direction thereof is the y direction. The terminals 31b and the terminals 33b are not facing each other and the interval therebetween is much larger than that between the terminals 31a and the terminals 33a. Therefore, the terminals 31b and the terminals 33b are connected to each other via the panel lines 27a, which are routed on the display panel 21. As can be seen in FIG. 4, the panel lines 27a are much longer than the panel terminals 27b because of the terminals 31b and the terminals 33b not facing each other.

In the connection structure illustrated in FIG. 4, the terminals 31a and 33a of the first terminals 31 and the third terminals 33 are arranged in the y direction and the terminal termination direction thereof is the −x or x direction. Therefore, the width (dimension in the y direction) of the terminal region can be made smaller than that in a case where all of the first terminals 31 and the third terminals 33 are arranged in the x direction so that the termination direction thereof is the y direction, as are the terminals 31b and 33b.

FIG. 5 is a diagram illustrating TCPs disclosed in Japanese Laid-Open Patent Publication No. 06-3684 (FIG. 4). A driving circuit 44 is mounted on each TCP 41. The TCP 41 includes TCP lines 42, and the lines 42 are connected to the driver IC 44. As illustrated in FIG. 5, a plurality of TCPs 41 arranged adjacent to one another in the x direction are attached to an edge of the display panel (not shown in FIG. 4) extending in the x direction. The TCP lines 42 extending in the x direction and formed in the adjacent TCPs 41 are connected to each other with their connected portions 43 being soldered together.

With the PWB-free structure described above with reference to FIG. 4 and FIG. 5, as compared to the TCP-based structure, the number of components can be reduced significantly, thereby also reducing the material cost and the assembly cost. However, the PWB-free structure has the following problems.

With the line structure of FIG. 4, the terminals 31a and 33a among the first and third terminals formed in the TCP are arranged in the y direction and the termination direction thereof is the x or −x direction, whereas the other terminals 31b and 33b are arranged in the x direction and the termination direction thereof is the y or −y direction. While the number of connection terminals required is usually about 30 to 60, the maximum number of terminals that can be arranged in the y direction, as with the terminals 31a and 33a, is about 5 (when the length of a connection terminal is 1 mm). Therefore, the rest of the terminals are all arranged in the x direction, as with the terminals 31b and 33b. As described above, the terminals 31b and the terminals 33b, which are arranged in the x direction, are connected to each other via the much longer panel lines 27a formed on the display panel.

However, the conductive film formed on the display panel has a thickness of less than 1 μm, typically some hundreds of nanometer, and thus has a high sheet resistance. Thus, lines formed by using the conductive film on the panel have a high sheet resistance. Therefore, when the terminals 31b and the terminals 33b are connected to each other by using the much longer panel lines 27a, which are routed on the display panel, the connection resistance is very high, thereby deteriorating the signal being supplied to the driving circuit of a TCP. Then, the driving circuit may not operate normally. Particularly, a source driving circuit of a liquid crystal panel is sensitive to signal deterioration. Therefore, no liquid crystal modules having source driving circuits which are attached to the panel using a PWB-free structure have been commercially manufactured and sold in the market.

In the structure illustrated in FIG. 5, the lines 42 formed in the adjacent TCPs 41 are directly connected to each other via the connected portions 43. Therefore, it is not necessary to route the panel lines on the display panel to connect the lines 42 formed in the adjacent TCPs 41 to each other. Thus, the structure of FIG. 5 does not suffer from the increase in the resistance value as does the connection structure of FIG. 4. However, the lines 42 formed in the adjacent TCPs 41 are soldered to each other, and the connection step needs to be performed completely separately from the step of positioning and fixing the TCPs on the display panel. This increases the production steps and the cost therefor. Moreover, it is difficult to realize a minute pitch with soldering as compared with ACF connection. For example, for the connection of 60 lines with a pitch of 0.3 mm, a connection area as long as 18 mm is required. Therefore, the size of the terminal region on the display panel increases, and the TCP area increases, thereby increasing the cost.

SUMMARY OF THE INVENTION

In order to overcome the problems described above, preferred embodiments of the present invention provide an electronic module having a PWB-free structure and a driving circuit board therefor, in which increases in the resistance value are prevented while increases in the size of the terminal region is also prevented.

An electronic module according to a preferred embodiment of the present invention includes an electronic circuit substrate including a plurality of circuit components, a plurality of signal lines connected respectively to the plurality of circuit components, and a plurality of substrate terminals provided in a terminal region; and a first driving circuit board and a second driving circuit board attached to the terminal region of the electronic circuit substrate while being arranged adjacent to each other in an x direction along the electronic circuit substrate, wherein each of the first and second driving circuit boards includes a substrate, a driving circuit provided on the substrate and including a plurality of input terminals and a plurality of output terminals, a first terminal section, a second terminal section, a third terminal section, and a plurality of lines connecting the first terminal section and the third terminal section to each other and being connected to the plurality of input terminals of the driving circuit; the first terminal section, the second terminal section and the third terminal section are arranged in this order in the x direction; the first terminal section, the second terminal section and the third terminal section include a plurality of first terminals, a plurality of second terminals and a plurality of third terminals, respectively, and each of the plurality of first terminals, the plurality of second terminals and the plurality of third terminals includes at least two terminals that are arranged next to each other along the x direction; the plurality of output terminals of the driving circuit of each of the first driving circuit board and the second driving circuit board are electrically connected to the plurality of signal lines of the electronic circuit substrate via the plurality of second terminals; the third terminal section of the first driving circuit board and the first terminal section of the second driving circuit board are electrically connected to each other by only the plurality of substrate terminals of the electronic circuit substrate; and a connection resistance between the third terminal of the first driving circuit board and the first terminal of the second driving circuit board is about 10 Ω or less.

According to another preferred embodiment of the present invention, each of the third terminals of the first driving circuit board corresponds to and faces a respective one of the plurality of first terminals of the second driving circuit board.

In a preferred embodiment, all of the plurality of first terminals, all of the plurality of second terminals and all of the plurality of third terminals are arranged next to each other along the x direction.

In another preferred embodiment, a first group of the plurality of first terminals and a first group of the plurality of third terminals are arranged in the x direction and a second group of the plurality of first terminals and a second group of the plurality of third terminals are arranged in the y direction which crosses the x direction.

In another preferred embodiment, in each of the first driving circuit board and the second driving circuit board, a termination direction of the second terminal section is a y direction which crosses the x direction, and one of a termination direction of the first terminal section and a termination direction of the third terminal section is the y direction while the other is a −y direction.

In one preferred embodiment, in each of the first driving circuit board and the second driving circuit board, a termination direction of the first terminal section, a termination direction of the second terminal section and a termination direction of the third terminal section are all a y direction which crosses the x direction.

In another preferred embodiment, in each of the first driving circuit board and the second driving circuit board, a first reference line, a second reference line and a third reference line are defined along edges of the first terminal section, the second terminal section and the third terminal section in their termination directions, respectively; and a distance d1 in a y direction between a midpoint of the second reference line and a midpoint of the first reference line is different from a distance d2 in the y direction between the midpoint of the second reference line and a midpoint of the third reference line.

In another preferred embodiment, in the first driving circuit board, a termination direction of the second terminal section is a y direction which crosses the x direction, and a termination direction of the first terminal section and a termination direction of the third terminal section are both a −y direction; and in the second driving circuit board, the termination direction of the second terminal section is the y direction which crosses the x direction, and the termination direction of the first terminal section and the termination direction of the third terminal section are both the y direction.

In a further preferred embodiment, in each of the first driving circuit board and the second driving circuit board, a first reference line, a second reference line and a third reference line are defined along edges of the first terminal section, the second terminal section and the third terminal section in their termination directions, respectively; and a distance d1 in the y direction between a midpoint of the second reference line and a midpoint of the first reference line is equal to a distance d2 in the y direction between the midpoint of the second reference line and a midpoint of the third reference line.

According to a further preferred embodiment, in each of the first driving circuit board and the second driving circuit board, the first terminal section and the third terminal section are axisymmetric with each other about a center line therebetween that is parallel to the y direction.

In another preferred embodiment, in each of the first driving circuit board and the second driving circuit board, the substrate includes a recessed portion and a protruding portion having sides parallel to a y direction which crosses the x direction along an edge of the substrate where the first terminal section is provided, and includes a recessed portion and a protruding portion having sides parallel to the y direction which crosses the x direction along an edge of the substrate where the third terminal section is provided; each of the plurality of first terminals and the plurality of third terminals includes a plurality of terminals that are arranged along the sides of the recessed portion and the protruding portion parallel to the y direction; a termination direction of the first terminal section is the x or −x direction, and a termination direction of the third terminal section is also the x or −x direction; and a termination direction of the second terminal section is the y direction.

In yet another preferred embodiment, the protruding portion along the edge where the third terminal section is provided in the first driving circuit board is placed so that the protruding portion can be fitted in the recessed portion along the edge where the first terminal section is provided in the second driving circuit board.

In another preferred embodiment, the plurality of third terminals of the first driving circuit board and the plurality of first terminals of the second driving circuit board are electrically connected to each other via ACF, ACP or NCP provided on the plurality of substrate terminals.

In yet a further preferred embodiment, a distance between the third terminal of the first driving circuit board and the first terminal of the second driving circuit board on the substrate terminal is about 4 mm or less.

In another preferred embodiment, a connection resistance between the third terminal of the first driving circuit board and the first terminal of the second driving circuit board is about 5 Ω or less.

According to a preferred embodiment of the present invention, a driving circuit board includes a substrate; and a driving circuit including a plurality of input terminals and a plurality of output terminals, a first terminal section, a second terminal section, a third terminal lines connect the first terminal section and the third terminal section to each other, and are connected to the plurality of input terminals of the driving circuit; the first terminal section, the second terminal section and the third terminal section are arranged in this order along an x direction of the substrate; the first terminal section, the second terminal section and the third terminal section include a plurality of first terminals, a plurality of second terminals and a plurality of third terminals, respectively, which are arranged next to each along the x direction; the plurality of second terminals are connected to the plurality of output terminals of the driving circuit; a termination direction of the second terminal section is a y direction which crosses the x direction; and one of a termination direction of the first terminal section and a termination direction of the third terminal section is the y direction while the other is a −y direction.

In a preferred embodiment, a first reference line, a second reference line and a third reference line are defined along edges of the first terminal section, the second terminal section and the third terminal section in their termination directions, respectively; and a distance d1 in the y direction between a midpoint of the second reference line and a midpoint of the first reference line is different from a distance d2 in the y direction between the midpoint of the second reference line and a midpoint of the third reference line.

Another preferred embodiment of the present invention provides a driving circuit board including a substrate; and a driving circuit including a plurality of input terminals and a plurality of output terminals, a first terminal section, a second terminal section, a third terminal section, and a plurality of lines, which are provided on the substrate, wherein the plurality of lines connect the first terminal section and the third terminal section to each other, and are connected to the plurality of input terminals of the driving circuit; the first terminal section, the second terminal section and the third terminal section are arranged in this order in an x direction along the substrate; the first terminal section, the second terminal section and the third terminal section include a plurality of first terminals, a plurality of second terminals and a plurality of third terminals, respectively, which are arranged next to each other along the x direction; the plurality of second terminals are connected to the plurality of output terminals of the driving circuit; a termination direction of the first terminal section, a termination direction of the second terminal section and a termination direction of the third terminal section are all a y direction which crosses the x direction; a first reference line, a second reference line and a third reference line are defined along edges of the first terminal section, the second terminal section and the third terminal section in their termination directions, respectively; and a distance d1 in the y direction between a midpoint of the second reference line and a midpoint of the first reference line is different from a distance d2 in the y direction between the midpoint of the second reference line and a midpoint of the third reference line.

In a further preferred embodiment, the second reference line and the first reference line are collinear with each other extending in the x direction, and the distance d1 is zero.

Still another preferred embodiment of the present invention provides a driving circuit board including a substrate; and a driving circuit including a plurality of input terminals and a plurality of output terminals, a first terminal section, a second terminal section, a third terminal section, and a plurality of lines, which are provided on the substrate, wherein the plurality of lines connect the first terminal section and the third terminal section to each other, and are connected to the plurality of input terminals of the driving circuit; the first terminal section, the second terminal section and the third terminal section are arranged in this order in an x direction; the first terminal section, the second terminal section and the third terminal section include a plurality of first terminals, a plurality of second terminals and a plurality of third terminals, respectively; the plurality of second terminals are connected to the plurality of out-put terminals of the driving circuit; the substrate includes a depressed portion and a protruding portion having sides parallel to a y direction which crosses the x direction along an edge of the substrate where the first terminal section is provided, and includes a recessed portion and a protruding portion having sides parallel to the y direction which crosses the x direction along an edge of the substrate where the third terminal section is provided; each of the plurality of first terminals, the plurality of second terminals and the plurality of third terminals includes at least two terminals that are arranged in the x direction, and each of the plurality of first terminals and the plurality of third terminals includes at least two terminals that are arranged along the sides of the recessed portion and the protruding portion parallel to the y direction; a termination direction of the first terminal section is the x or −x direction, a termination direction of the third terminal section is also the x or −x direction, and a termination direction of the second terminal section is the y direction.

In a preferred embodiment, the protruding portion along the edge where the first terminal section is provided has such a shape that the protruding portion can be fitted in the recessed portion along the edge where the third terminal section is provided, and the protruding portion along the edge where the third terminal section is provided has such a shape that the protruding portion can be fitted in the recessed portion along the edge where the first terminal section is provided.

According to another preferred embodiment, a driving circuit board includes a pair of driving circuit boards including a first driving circuit board and a second driving circuit board, each of the first and second driving circuit boards including a substrate; and a driving circuit including a plurality of input terminals and a plurality of output terminals, a first terminal section, a second terminal section, a third terminal section, and a plurality of lines, which are provided on the substrate, wherein in each of the first driving circuit board and the second driving circuit board, the plurality of lines connect the first terminal section and the third terminal section to each other, and are connected to the plurality of input terminals of the driving circuit; the first terminal section, the second terminal section and the third terminal section are arranged in this order in an x direction along the substrate; the first terminal section, the second terminal section and the third terminal section include a plurality of first terminals, a plurality of second terminals and a plurality of third terminals, respectively, which are arranged next to each other along the x direction; and the plurality of second terminals are connected to the plurality of output terminals of the driving circuit, and wherein in the first driving circuit board, a termination direction of the second terminal section is a y direction which crosses the x direction, and a termination direction of the first terminal section and a termination direction of the third terminal section are both a −y direction; and in the second driving circuit board, the termination direction of the first terminal section, the termination direction of the second terminal section and the termination direction of the third terminal section are all the y direction.

In another preferred embodiment, in each of the first driving circuit board and the second driving circuit board, a first reference line, a second reference line and a third reference line are defined along edges of the first terminal section, the second terminal section and the third terminal section in their termination directions, respectively; and a distance d1 in the y direction between a midpoint of the second reference line and a midpoint of the first reference line is equal to a distance d2 in the y direction between the midpoint of the second reference line and a midpoint of the third reference line.

In a further preferred embodiment, in each of the first driving circuit board and the second driving circuit board, the first terminal section and the third terminal section are axisymmetric with each other about a center line therebetween that is parallel to the y direction.

In yet another preferred embodiment, an absolute value of a difference Δd between the distance d1 and the distance d2 is about 0.5 mm or less.

In another preferred embodiment, the plurality of first terminals of the first terminal section are all arranged next to each other along the x direction, and the plurality of third terminals of the third terminal section are all arranged next to each other along the x direction.

It is preferred that the driving circuit board is a COF or a TCP in various preferred embodiments of the present invention.

Various advantages, features and functions of preferred embodiments of the present invention will now be described.

The electronic module of various preferred embodiments of the present invention includes an electronic circuit substrate, and a plurality of driving circuit boards attached to a terminal region of the electronic circuit substrate while being arranged adjacent to one another in the x direction. The plurality of driving circuit boards are electrically connected to one another. In the electronic module of preferred embodiments of the present invention, adjacent driving circuit boards are electrically connected to one another by only substrate terminals provided on the electronic circuit substrate with the connection resistance therebetween being about 10 Ω or less. Therefore, deterioration of a signal propagating through the plurality of driving circuit boards is reliably prevented.

Each driving circuit board used in the electronic module according to various preferred embodiments of the present invention includes a substrate, a driving circuit provided on the substrate, a first terminal section, a second terminal section, a third terminal section, and a plurality of lines. The driving circuit includes a plurality of input terminals and a plurality of output terminals. Moreover, the plurality of lines connect the first terminal section and the third terminal section to each other, and are connected to the input terminals of the driving circuit. The first terminal section, the second terminal section and the third terminal section are arranged in this order in the x direction. The first terminal section, the second terminal section and the third terminal section include a plurality of first terminals, a plurality of second terminals and a plurality of third terminals, respectively. Each of the plurality of first terminals, the plurality of second terminals and the plurality of third terminals includes at least two terminals that are arranged in the x direction. The output terminals of the driving circuit and the signal lines of the electronic circuit substrate are electrically connected to each other via the second terminals. The electrical connection between two adjacent driving circuit boards is made by electrically connecting the third terminals of one driving circuit board to the first terminals of the other driving circuit board located adjacent thereto along the x direction.

As described above, each of the plurality of first terminals, the plurality of second terminals and the plurality of third terminals, provided on the driving circuit board, includes at least two terminals that are arranged in the x direction, and the arrangement direction is the same as that of the plurality of driving circuit boards attached to the terminal region of the electronic circuit substrate. Therefore, as compared with a case where the terminals of a driving circuit board are all arranged in the y direction, the width in the y direction of the terminal region of the electronic circuit substrate is greatly reduced, whereby the bezel of the electronic module can be narrowed.

Other features, elements, characteristics and advantages of the present invention will become more apparent from the following detailed description of preferred embodiments thereof with reference to the attached drawings.

BRIEF DESCRIPTION OF THE DRAWINGS

FIG. 7A and FIG. 7B are diagrams illustrating a source COF of Preferred Embodiment 1, wherein FIG. 7A is an enlarged view of a broken line region A in FIG. 6, and FIG. 7B is a cross-sectional view taken along line 7A-7A' of FIG. 7A.

DETAILED DESCRIPTION OF PREFERRED EMBODIMENTS

Figure 1:
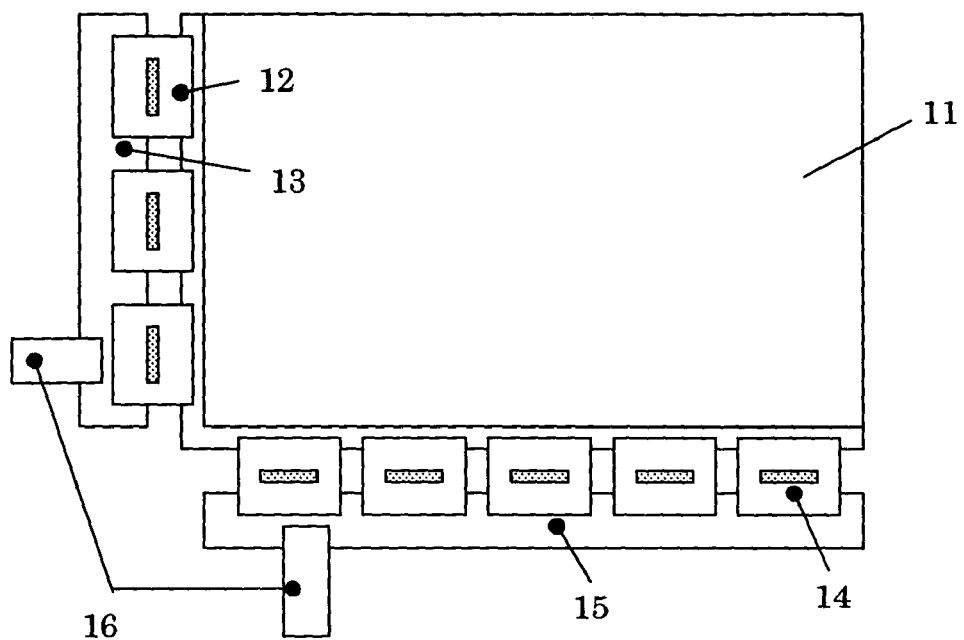
FIG. 1 is a diagram schematically illustrating the structure of a liquid crystal module using the conventional TCP-based structure.

An electronic module of preferred embodiments of the present invention includes an electronic circuit substrate, and a plurality of driving circuit boards and a plurality of wiring boards attached to a terminal region of the electronic circuit substrate while being arranged in the x direction. Each driving circuit board includes at least a substrate and a driving circuit. Each wiring board includes a substrate, an upstream terminal section, a downstream terminal section, and transfer lines for connecting the upstream and downstream terminal sections to each other. The transfer lines of the wiring board are electrically connected to the input terminals of the driving circuit of the driving circuit board.

One of the unique features of the electronic module of various preferred embodiments of the present invention is that adjacent wiring boards are electrically connected to one another all by substrate terminals provided on the electronic circuit substrate with the connection resistance therebetween being approximately 10 Ω or less. Since the connection resistance between adjacent wiring boards is sufficiently small, deterioration of a signal propagating through the plurality of wiring boards is suppressed, thereby preventing a deteriorated signal from being supplied to the driving circuit boards.

An electronic module according to a first aspect of various preferred embodiments of the present invention will now be described. A feature of the electronic module according to the first aspect is that the substrate of the driving circuit board and that of the wiring board are integrated together to define one driving circuit board. In other words, the driving circuit and the transfer lines are located on a single driving circuit board.

The driving circuit board according to the first aspect of various preferred embodiments of the present invention will now be described in detail.

The driving circuit board includes a substrate, a driving circuit provided on the substrate, a first terminal section, a second terminal section, a third terminal section, and a plurality of lines. The driving circuit includes a plurality of input terminals and a plurality of output terminals. Moreover, the plurality of lines connect the first terminal section and the third terminal section to each other, and are connected to the input terminals of the driving circuit.

The first terminal section, the second terminal section and the third terminal section are arranged in this order in the x direction. The first terminal section, the second terminal section and the third terminal section include a plurality of first terminals, a plurality of second terminals and a plurality of third terminals, respectively. Each of the plurality of first terminals, the plurality of second terminals and the plurality of third terminals preferably includes at least two terminals that are arranged in the x direction.

The output terminals of the driving circuit and the signal lines of the electronic circuit substrate are electrically connected to each other via the second terminals. The electrical connection between two adjacent driving circuit boards is made by electrically connecting the third terminals of one driving circuit board to the first terminals of the other adjacent driving circuit board. As described above, the third terminals and the first terminals of the adjacent driving circuit boards are electrically connected to each other all by substrate terminals provided on the electronic circuit substrate, with the connection resistance between the third terminal of one driving circuit board and the first terminal of the other driving circuit board being approximately 10 Ω or less. That is, the third terminal section and the first terminal section of the adjacent driving circuit boards are electrically connected to each other by only substrate terminals provided on the electronic circuit substrate, with the connection resistance between the third terminal of one driving circuit board and the first terminal of the other driving circuit board being approximately 10 Ω or less. Note that the connection resistance between terminals herein refers to the electrical resistance of the entire path between one terminal to the other, and it includes the electrical resistance and the contact resistance of any electrical connection material (e.g., ACF) as well as the resistance of the substrate terminals.

As described above, in the electronic module of various preferred embodiments of the present invention, each of the plurality of first terminals, the plurality of second terminals and the plurality of third terminals preferably includes at least two terminals that are arranged in the x direction, and the arrangement direction is the same as the direction in which the plurality of driving circuit boards attached to the terminal region of the electronic circuit substrate are arranged. Therefore, as compared with a case where the terminals of a driving circuit board are all arranged in the y direction, the width in the y direction of the terminal region of the electronic circuit substrate is significantly reduced, whereby the bezel of the electronic module can be narrowed. The terminal region herein refers to a region of the electronic circuit substrate that is necessary for attaching the driving circuit boards to the electronic circuit substrate. The terminal region includes, for example, the region where the electronic circuit substrate overlaps with and is bonded to the driving circuit boards and the region where substrate terminals (described later) are formed.

Furthermore, in the electronic module of various preferred embodiments of the present invention described above, the third terminals of one of a pair of adjacent driving circuit boards are electrically connected to the first terminals of the other one of the driving circuit boards all by substrate terminals provided on the electronic circuit substrate, with the connection resistance between the third terminal and the first terminal being approximately 10 Ω or less. Since the connection resistance between terminals of adjacent driving circuit boards is sufficiently small, deterioration of a signal propagating through the plurality of driving circuit boards is effectively prevented. Therefore, preferred embodiments of the present invention can be applied to the attachment of source driving circuits to a liquid crystal panel, and a desirable operation of an electronic module can be realized.

Figure 2:
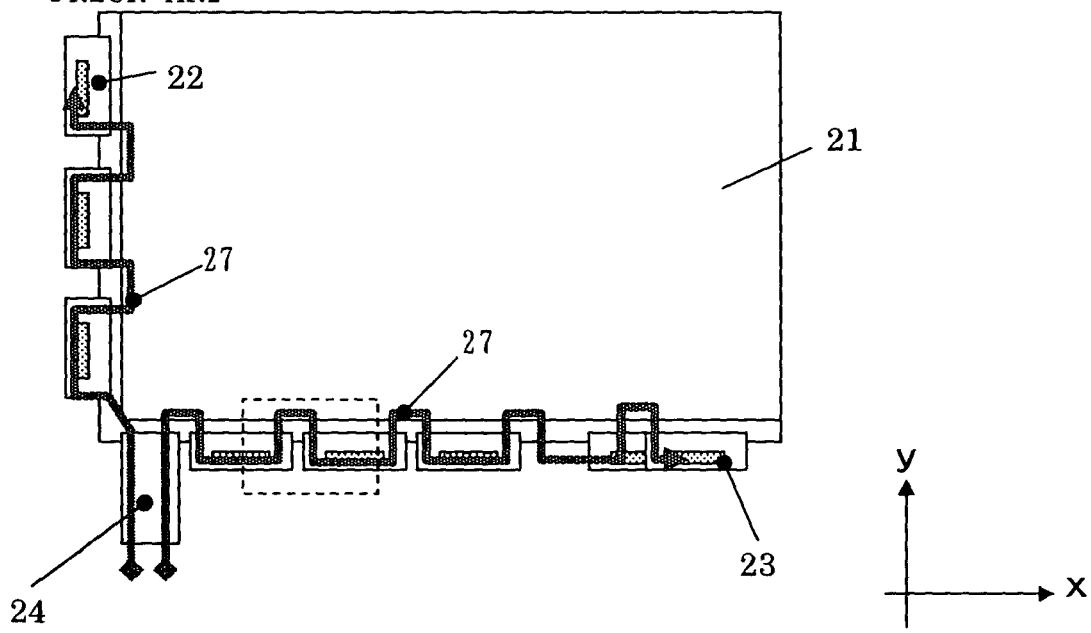
FIG. 2 is a diagram schematically illustrating the structure of a liquid crystal module using the conventional PWB-free structure.

The substrate terminals are preferably conductive films formed on the substrate and may be a portion connected to a terminal of a driving circuit board. The electronic module of preferred embodiments of the present invention is preferably designed so that the connection resistance on the substrate terminal is approximately 10 Ω or less. In one example of preferred embodiments of the present invention, the substrate terminal typically has a length of about 4 mm or less, and more preferably about 1 mm or less, and is thus much shorter than the conventional panel line illustrated in FIG. 2.

Thus, even when a conductive film on the substrate that is thinner than the conductive layer of a driving circuit board (having a thickness of about 5 μm to about 35 μm, for example) and has a high sheet resistance, is used for electrical connection, the connection resistance can be suppressed to be about 10 Ω or less, and more preferably about 5 Ω or less, by reducing the length of each substrate terminal (the distance between terminals to be connected to each other) as described above.

Moreover, as will be described later, the substrate terminal (panel terminal) is typically linear in shape, and a plurality of substrate terminals for connecting the third terminals and the first terminals of a pair of driving circuit boards preferably have substantially congruent shapes.

Moreover, the attachment of driving circuit boards to the display panel can be done by using ACF, for example, whereby the production process will not be complicated.

The electronic module of preferred embodiments of the present invention can suitably be used in various electronic devices such as a liquid crystal display device, an organic EL device, or an image sensor, or other appropriate devices.

Preferred Embodiment 1

An electronic module according to one preferred embodiment of the present invention will now be described with reference to the drawings. The following preferred embodiments of the present invention are directed to a liquid crystal module as an electronic module. Accordingly, the electronic circuit substrate described above corresponds to the display panel of a liquid crystal module. The display panel includes, as its circuit components, TFTs for driving pixels, for example, source lines or gate lines connected to the TFTs as signal lines. Source driving circuit boards and gate driving circuit boards are attached to the display panel. Each source driving circuit board includes, mounted thereon, a driving circuit for supplying a signal to source lines, and each gate driving circuit board includes, mounted thereon, a driving circuit for supplying a signal to gate lines. The driving circuit board may be, for example, a TCP or a COF (Chip on Film). The following description illustrates a case where the driving circuit board of a preferred embodiment of the present invention is applied to a COF source driving circuit board.

Note that in a liquid crystal module 100, it is preferred that a COF, rather than a TCP, is used for the source driving circuit board. While a TCP has a limitation on the maximum number of lines that can be routed under the driving circuit, a COF is free of such a limitation. In a PWB-free structure, when the number of signals to be transferred increases, it will be necessary to route a large number of lines under the driving circuit in order to input a driving power supply/signal to the driving circuit and to transfer the driving power supply/signal to adjacent driving circuit boards. On the source side of the liquid crystal module 100, there are a large number of signals to be transferred (e.g., 40 signals). Thus, it is preferred that a COF, rather than a TCP, is used for the source driving circuit board. On the gate side, there are a smaller number of signals to be transferred (e.g., 10 signals) than on the source side, and therefore TCP is used.

Figure 6:
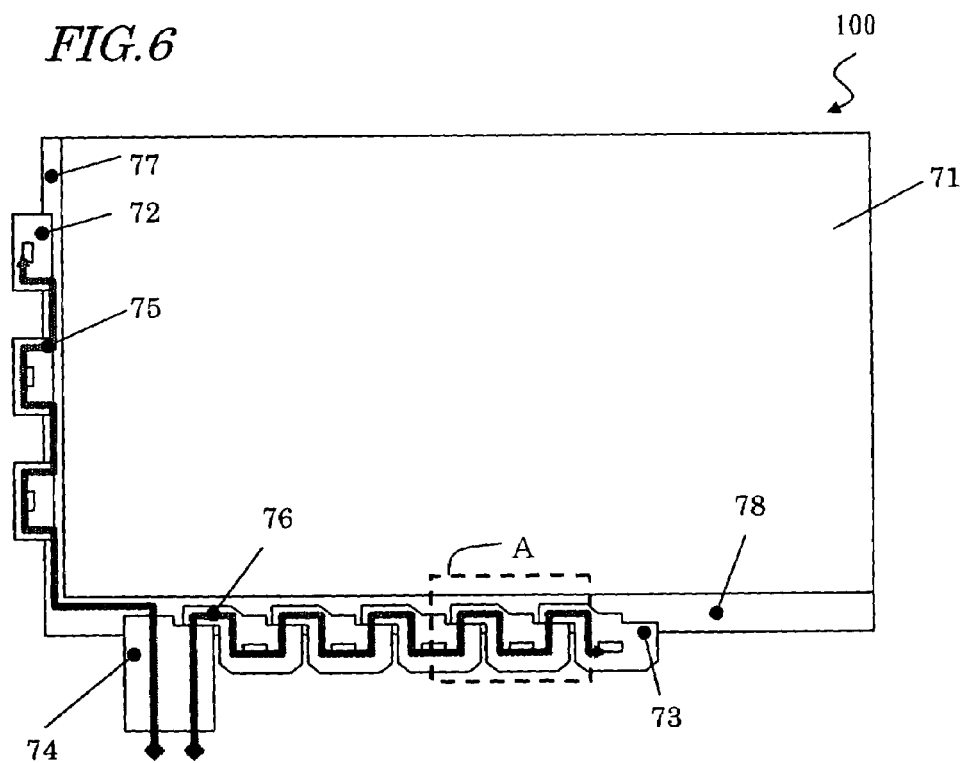
FIG. 6 is a diagram schematically illustrating a liquid crystal module of a first aspect of preferred embodiments of the present invention.

FIG. 6 is a diagram schematically illustrating the liquid crystal module 100 of the present preferred embodiment. As illustrated in FIG. 6, the liquid crystal module 100 includes a display panel 71. The display panel 71 includes a plurality of TFTs (not shown), a plurality of source lines (not shown) and gate lines (not shown) connected to the TFTs, and a plurality of panel terminals (not shown in FIG. 6) provided in a source terminal region 78.

The liquid crystal module 100 further includes a plurality of COFs 73 and an FPC 74 attached to the source terminal region 78 of the display panel 71, and a plurality of gate TCPs 72 attached to a gate terminal region 77. The FPC 74 is connected to an external circuit board (not shown).

In the liquid crystal module 100, a PWB-free structure is used for the connection between the display panel 71 and the source COFs 73 and for the connection between the display panel 71 and the gate TCPs 72. A source driving power supply/signal 76 supplied to the FPC 74 is transmitted successively through the source COFs 73, and a gate driving power supply/signal 75 supplied to the FPC 74 is transmitted successively through the gate TCPs 72. Note that the FPC 74 may alternatively be attached to the gate terminal region 77. Alternatively, at least one of the plurality of COFs 73 and the plurality of gate TCPs 72 may additionally have a function as the FPC 74.

The conventional example illustrated in FIG. 1 uses a connection structure in which the PWB 15 is connected to a driving circuit board such as the TCP 14, and the FPC 16 is connected to the PWB 15 so that a driving power supply/signal is supplied to the driving circuit boards 14 via the FPC 16 and the PWB 15. In contrast, the PWB-free structure used in the present preferred embodiment does not require the PWB, and provides the following advantages over the conventional connection structure of FIG. 1.

First, eliminating the need for the PWB allows for a reduction in the width of the bezel of the module and a reduction in the thickness thereof. Eliminating the need for the PWB also allows for a reduction in the material cost. It further eliminates the need for providing a connection area on a driving circuit board that is needed for the connection of the PWB to the driving circuit board such as a COF or a TCP, thereby allowing for a reduction in the size of the driving circuit board, a reduction in the material cost, and a reduction in the width of the bezel of the module. Moreover, the material (e.g., ACF) used for the connection between the PWB and the driving circuit boards is no longer needed, thereby further reducing the material cost. Furthermore, the connection step for connecting the PWB with the driving circuit boards is no longer needed, thereby reducing the assembly facilities and simplifying the production process. This also reduces the defect rate and increases the production yield. The increase in the production yield significantly reduces the occurrence of secondary defects that may occur during repair. With a reduced likelihood of secondary defects occurring and a reduced number of components required for production of the electronic module, it is possible to provide a highly reliable module. Moreover, as the need for the PWB is eliminated, the size of COF is not influenced by the thickness of the module, thereby allowing for sharing of COF.

The liquid crystal module 100 shown in FIG. 6 has the PWB-free structure having the various advantages as described above.

In the liquid crystal module 100 of the present preferred embodiment, adjacent source COFs 73 are electrically connected to one another by only the panel terminals provided on the display panel 71. In the liquid crystal module 100, the interval between the input terminals and the output terminals of adjacent COFs 73 is much smaller than that in the prior art, as will be described later with reference to FIG. 7A and FIG. 7B. Therefore, adjacent COFs 73 can be electrically connected to each other with a sufficiently short connection interval on the panel terminals (substrate terminals), and it is no longer necessary to make the connection with long panel lines that are routed on the display panel.

When long panel lines that are routed on the display panel are used for the electrical connection between adjacent COFs 73, the resistance value between the adjacent COFs 73 will be high. For example, when a line formed on a COF has a thickness of about 10 μm (Cu, volume resistivity of about 0.01619 μΩ·m), the sheet resistance is increased approximately 76-fold even when the thickness of a panel line is about 200 nm (Al, volume resistivity of about 0.0262 μΩ·m), and if the length of a line having a width of about 50 μm exceeds about 4 mm, the resistance of the line in the connected portion between the adjacent COFs 73 alone may exceed about 10 Ω.

With the liquid crystal module 100, however, the connection is made with a sufficiently short connection interval on the panel terminals as described above, whereby the resistance value can be about 10 Ω or less, preferably about 5 Ω or less, and more preferably about 2 Ω to about 3 Ω. Therefore, deterioration of a signal received through the FPC 74 and successively propagating through the plurality of COFs 73 is prevented. Moreover, the number of source COFs 73 that can be driven by using a single FPC can be increased, whereby the number of FPCs to be mounted can be reduced.

Figure 7A:
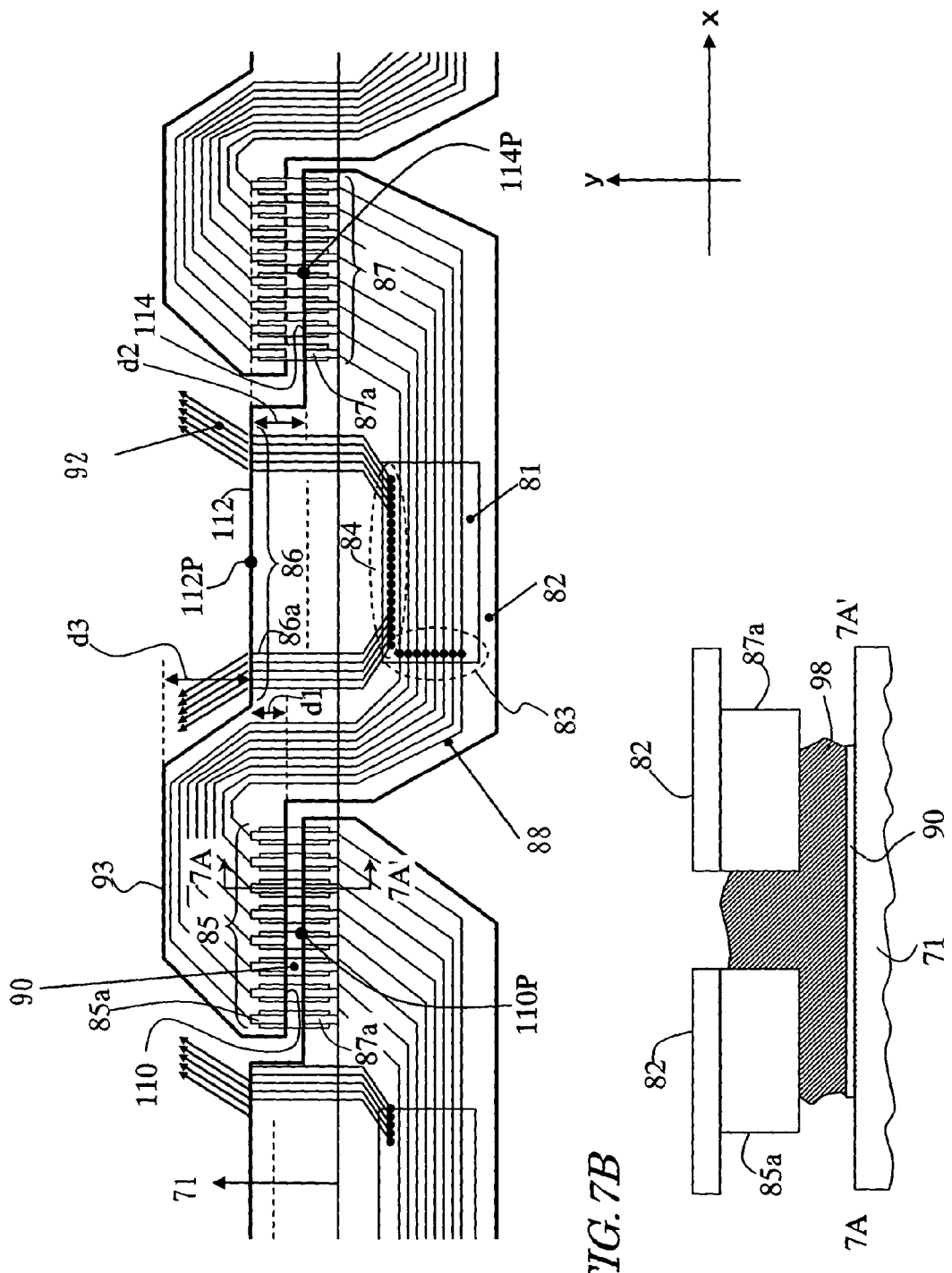

Next, the source COF 73 used in the liquid crystal module 100 will be described with reference to FIG. 7A and FIG. 7B. FIG. 7A is an enlarged view of a broken line region A in FIG. 6. In the liquid crystal module 100, a plurality of COFs 73 each having a left-right asymmetric shape, as illustrated in FIG. 7A, are attached to the display panel 71 while being arranged adjacent to one another in the x direction.

As illustrated in FIG. 7A, the source COF 73 includes a film-shaped substrate 82, a driving circuit 81 (e.g., an IC chip) provided on the substrate 82, a first terminal section 85, a second terminal section 86, a third terminal section 87, and a plurality of COF lines 88. The driving circuit 81 includes a plurality of input terminals 83 and a plurality of output terminals 84. The plurality of COF lines 88 connect the first terminal section 85 and the third terminal section 87 to each other, and are connected to the plurality of input terminals 83 of the driving circuit 81.

In the liquid crystal module 100, a driving power supply/signal received from an external circuit through the FPC 74 successively propagates through the plurality of COFs 73, as described above with reference to FIG. 6. In each COF 73, the driving power supply/signal is input to the COF lines 88 through the first terminal section 85 and is output through the third terminal section 87, as illustrated in FIG. 7A. The signal output through the third terminal section 87 is then input to the next COF 73 through the first terminal section 85 thereof via panel terminals 90 provided on the display panel 71.

Figure 7B:
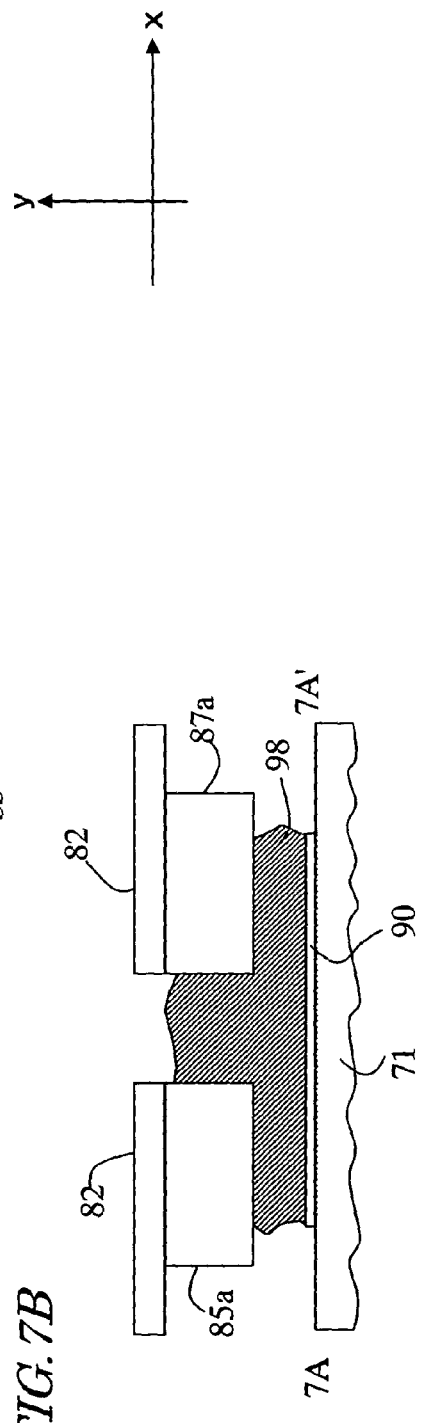

FIG. 7B is a cross-sectional view taken along line 7A-7A' of FIG. 7A. As illustrated in FIG. 7B, the third terminal section 87 of a COF 73 and the first terminal section 85 of an adjacent COF 73 are electrically connected to each other via an ACF 98 between the third terminal section 87 and the panel terminals 90, the panel terminals 90, and the ACF 98 between the panel terminals 90 and the first terminal section 85. The material used for the electrical connection between the terminals is not limited to ACF, but may alternatively be NCP (Non Conductive Resin Paste), ACP (Anisotropic Conductive Paste), or the other suitable material. Note however that the use of ACF is preferred in view of the work efficiency.

The driving power supply/signal successively propagates through the plurality of COFs 73 as described above.

The driving power supply/signal is input from the COF lines 88 to the driving circuit 81 via the input terminals 83. The driving circuit 81 outputs a predetermined signal via the output terminals 84 thereof. The signal output through the output terminals 84 is output from the COF 73 via the second terminal section 86, and is supplied to source lines via panel terminals 92 formed on the display panel 71. Since the source line has a higher resistance than that of a COF line, the limitation on the connection resistance between the second terminal section 86 and the source lines is more relaxed than the limitation on the connection resistance between the first terminal section 85 and the third terminal section 87. Therefore, the second terminal section 86 and the source lines may be connected to each other with a connection structure similar to that in the prior art, for example.

Figure 3:
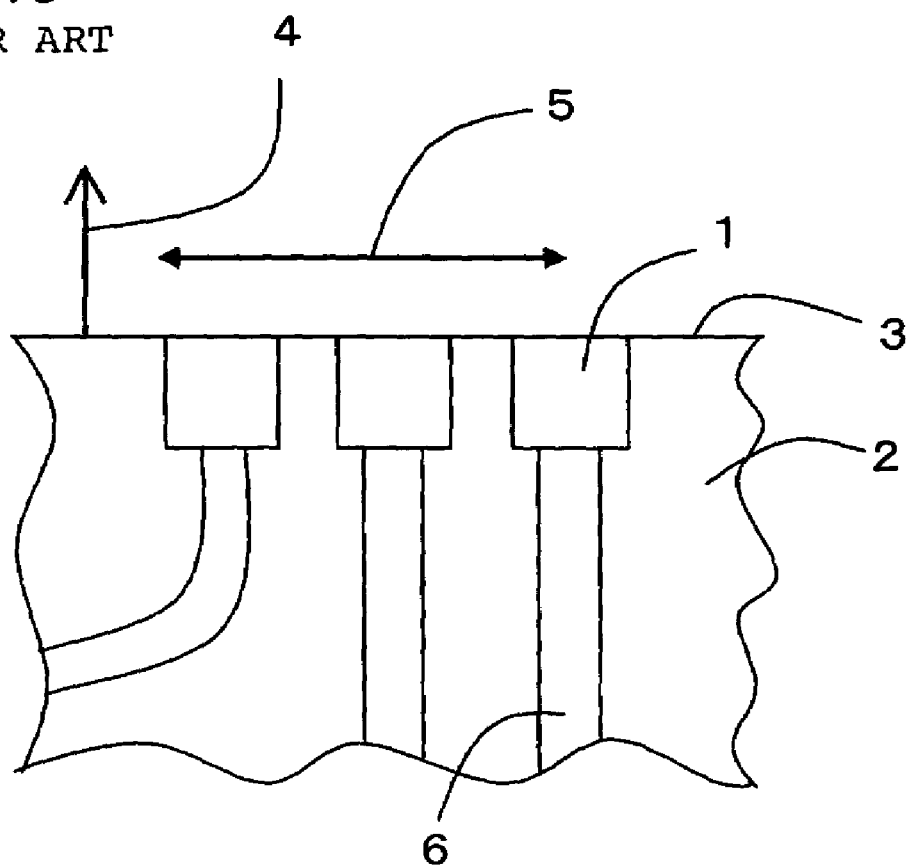
FIG. 3 is a diagram illustrating the "terminal termination direction" and the "terminal arrangement direction".

Next, the first terminal section 85, the second terminal section 86 and the third terminal section 87 of the COF 73 will be described. As defined above with reference to FIG. 3, the direction 4 that is normal to the side surface 3 of the substrate 2 including an edge of the substrate 2 along which the terminal 1 is located will be referred to herein as the "terminal termination direction", and where a plurality of terminals 1 are provided, a direction 5 in which the successive terminals 1 are arranged adjacent to each other will be referred to as the "terminal arrangement direction".

As illustrated in FIG. 7A, the first terminal section 85, the second terminal section 86 and the third terminal section 87 are arranged in this order in the x direction, as determined from the x-y grid shown in the lower right hand corner of FIG. 7A. The first terminal section 85, the second terminal section 86 and the third terminal section 87 include a plurality of first terminals 85a, a plurality of second terminals 86a and a plurality of third terminals 87a, respectively. The plurality of first terminals 85a, the plurality of second terminals 86a and the plurality of third terminals 87a are all arranged in the x direction. The termination direction of the second terminal section 86 is the y direction, the termination direction of the first terminal section 85 is the −y direction, and the termination direction of the third terminal section 87 is the y direction.

In the COF 73, the first terminal section 85 and the third terminal section 87 are asymmetric with each other about a center line therebetween that is parallel to the y direction. In the following description, it is assumed that a first reference line 110 is defined along the edge of the first terminal section 85 in the termination direction, a second reference line 112 is defined along the edge of the second terminal section 86 in the termination direction, and a third reference line 114 is defined along the edge of the third terminal section 87 in the termination direction.

The midpoints of the first reference line 110, the second reference line 112 and the third reference line 114 are denoted as 110P, 112P and 114P, respectively. In the COF 73 of FIG. 7A, a distance d1 in the y direction between the midpoint 112P of the second reference line 112 and the midpoint 110P of the first reference line 110 is different from a distance d2 in the y direction between the midpoint 112P of the second reference line 112 and the midpoint 114P of the third reference line 114, and d1 and d2 satisfy |d1|<|d2|. The absolute value of the difference $\Delta d$ ($\Delta d=|d1-d2|$) between the distance d1 and the distance d2 is about 0.5 mm or less. The distance difference $\Delta d$ can easily be as small as about 0.5 mm or less, though it is limited by the substrate (tape) machining precision (typically, the tape punching precision). Of course, the distance $\Delta d$ defines the length of the panel terminal that substantially contributes to the electrical connection, and $\Delta d$ is preferably a small value in order to obtain a small connection resistance between terminals. The value of $\Delta d$ is preferably about 0.3 mm or less though it depends on the specifications of the liquid crystal module.

In the COF 73, the termination direction of one of the terminal sections used for the propagation of the driving power supply/signal to the next COF (the first terminal section 85 in FIG. 7A and FIG. 7B) is the −y direction, and the COF lines 88 are routed partially beyond the second reference line 112 in the y direction so as to minimize the area of the substrate 82. Therefore, an edge 93 of the COF 73 is located beyond the second reference line 112 in the y direction. Where the interval between the edge 93 and the second reference line 112 is denoted as d3, the width of the COF 73 in the y direction is larger than that of the conventional TCP illustrated in FIG. 4 by the distance d3. Therefore, when the COF 73 is attached to the display panel 71, there is a disadvantage that the width of the terminal region in the y direction increases by the distance d3.

However, the disadvantage can be overcome by miniaturizing the COF lines 88 to reduce the line pitch. While the width and the pitch of the first terminals 85a and the panel terminals 90 need to be sufficiently large (e.g., about 100 μm or more) for decreasing the connection resistance of ACF, the width and the pitch of the COF lines 88 may be smaller (e.g., about 30 μm or less). Therefore, the COF lines 88 can be routed with a small pitch up to a point near the first terminals 85a, thereby reducing the distance d3. Moreover, the distance d3 can be reduced also by connecting the COF lines 88 to the first terminals 85a at a skewed angle as illustrated in FIG. 7A. For example, where the line pitch of the COF lines 88 is about 30 μm and the number of lines is 60, the increase (d3) in the width of the terminal region is as small as about 1.8 mm.

Next, a method for producing the liquid crystal module 100 will be described.

First, a TFT substrate including TFTs formed by using amorphous Si, a color filter glass, and the display panel 71 including a liquid crystal material are prepared. ACF is attached to predetermined regions of the gate terminal region 77 and the source terminal region 78 of the display panel 71. Then, the gate TCPs 72, the source COFs 73 and the FPC 74 are positioned with respect to the corresponding terminals formed on the display panel 71, and then temporarily press-bonded onto ACF.

Then, the gate TCPs 72, the source COFs 73 and the FPC 74 are bonded by thermocompression bonding using a linear thermocompression bonding tool. The press bonding conditions are preferably approximately 200° C., 2 MPa and 10 sec. Note that three gate TCPs are press-bonded in a single step, and five source COFs and an FPC are press-bonded in another step. Thus, for the liquid crystal module 100 illustrated in FIG. 6, the total number of press bonding steps to be performed is two.

The liquid crystal module 100 is produced through these steps described above. Then, an external circuit board is connected to the FPC 74, and the liquid crystal module 100 is placed in a backlight unit, thus finally obtaining a liquid crystal display device.

As described above, the method for producing the liquid crystal module 100 eliminates the step of connecting the source PWB, which is required for the conventional TCP-based structure, whereby the number of connection steps can be reduced as compared with a liquid crystal module using the conventional TCP-based structure. Moreover, the FPC 74 can be connected to the display panel 71 in the same step as the source COF 73, thereby reducing the number of connection steps to be performed.

While FIG. 7A shows a case where one driving circuit 81 is mounted on each COF 73, the number of driving circuits 81 mounted on each COF 73 is not limited to one. For example, two driving circuits 81 may alternatively be mounted on each COF 73 as illustrated in FIG. 8.

When two driving circuits 81 are mounted on each COF 73, two adjacent driving circuits 81 can be connected to each other by the COF lines 88. Thus, when the COF 73 illustrated in FIG. 8 is used in the liquid crystal module 100, the number of panel terminals 90 required for the connection between adjacent COFs 73 can be reduced to half as compared with a case when the COF 73 illustrated in FIG. 7A is used. The panel terminals 90 have a smaller thickness and thus a higher resistance than the COF lines 88. Therefore, if the number of the panel terminals 90 can be reduced by using the COF 73 illustrated in FIG. 8, the line resistance can be further reduced from that when the COF 73 illustrated in FIG. 7A and FIG. 7B is used. Then, it is possible to further suppress deterioration of a signal received through the FPC 74, and to further increase the number of driving circuits 81 that can be driven by a single FPC 74.

Figure 8:
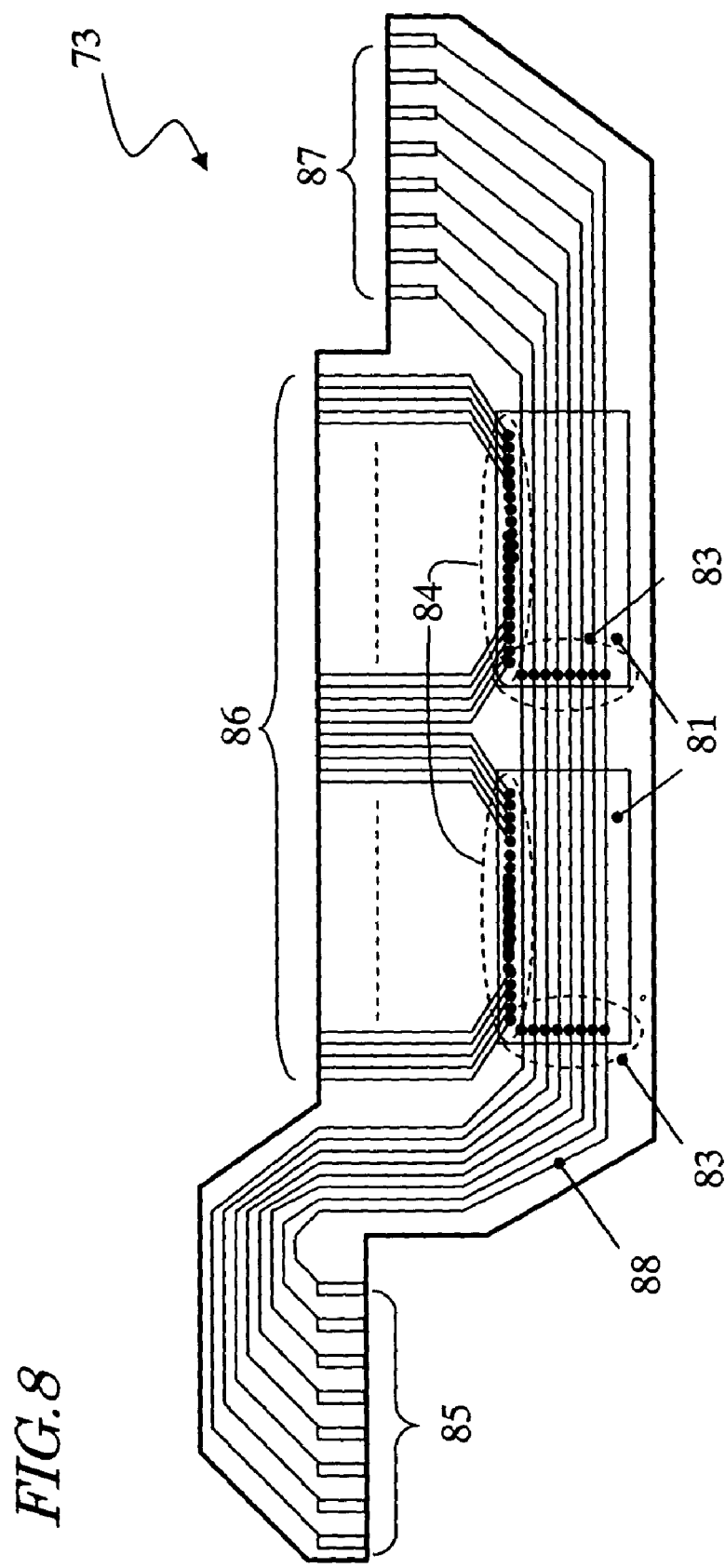
FIG. 8 is a diagram illustrating a source COF according to a variation of Preferred Embodiment 1.

While FIG. 8 shows a case where two driving circuits 81 are mounted on each COF 73, the number of driving circuits to be mounted on each COF 73 may alternatively be three or more.

Moreover, while the liquid crystal module 100 illustrated in FIG. 6 includes a single FPC 74 by which signals are supplied to five COFs 73, the number of FPCs 74 to be used is not limited to one. For example, two FPCs 74 may be connected to the display panel 71, as illustrated in FIG. 9.

Figure 9:
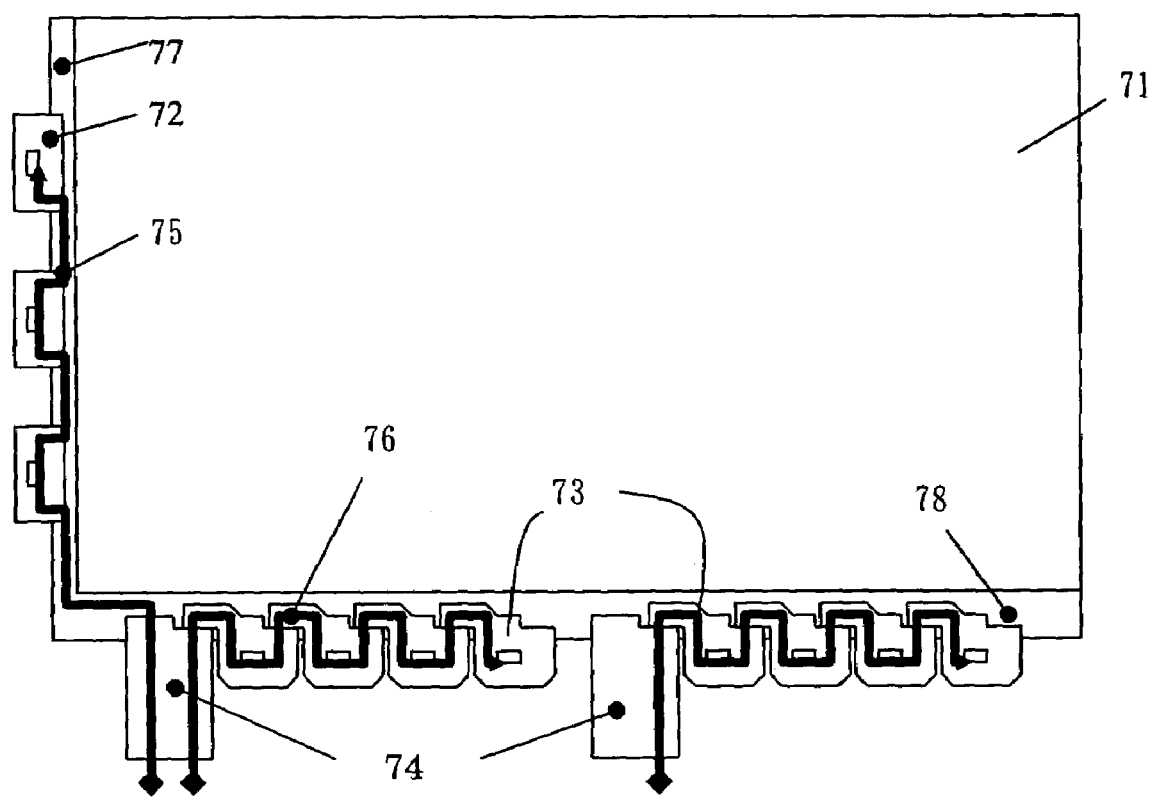
FIG. 9 is a diagram schematically illustrating a liquid crystal module according to a variation of Preferred Embodiment 1.

The liquid crystal module illustrated in FIG. 9 preferably includes eight source COFs 73, each including one driving circuit 81 mounted thereon, and signals are supplied to four COFs 73 by each FPC 74. Typically, the number of source COFs 73 that can be driven by a single FPC 74 is typically six or less where one driving circuit is mounted on each source COF 73. Therefore, the number of FPCs 74 to be connected to the display panel is variable and is determined in view of the number of source COFs and driving circuits needed.

Preferred Embodiment 2

Figure 10:
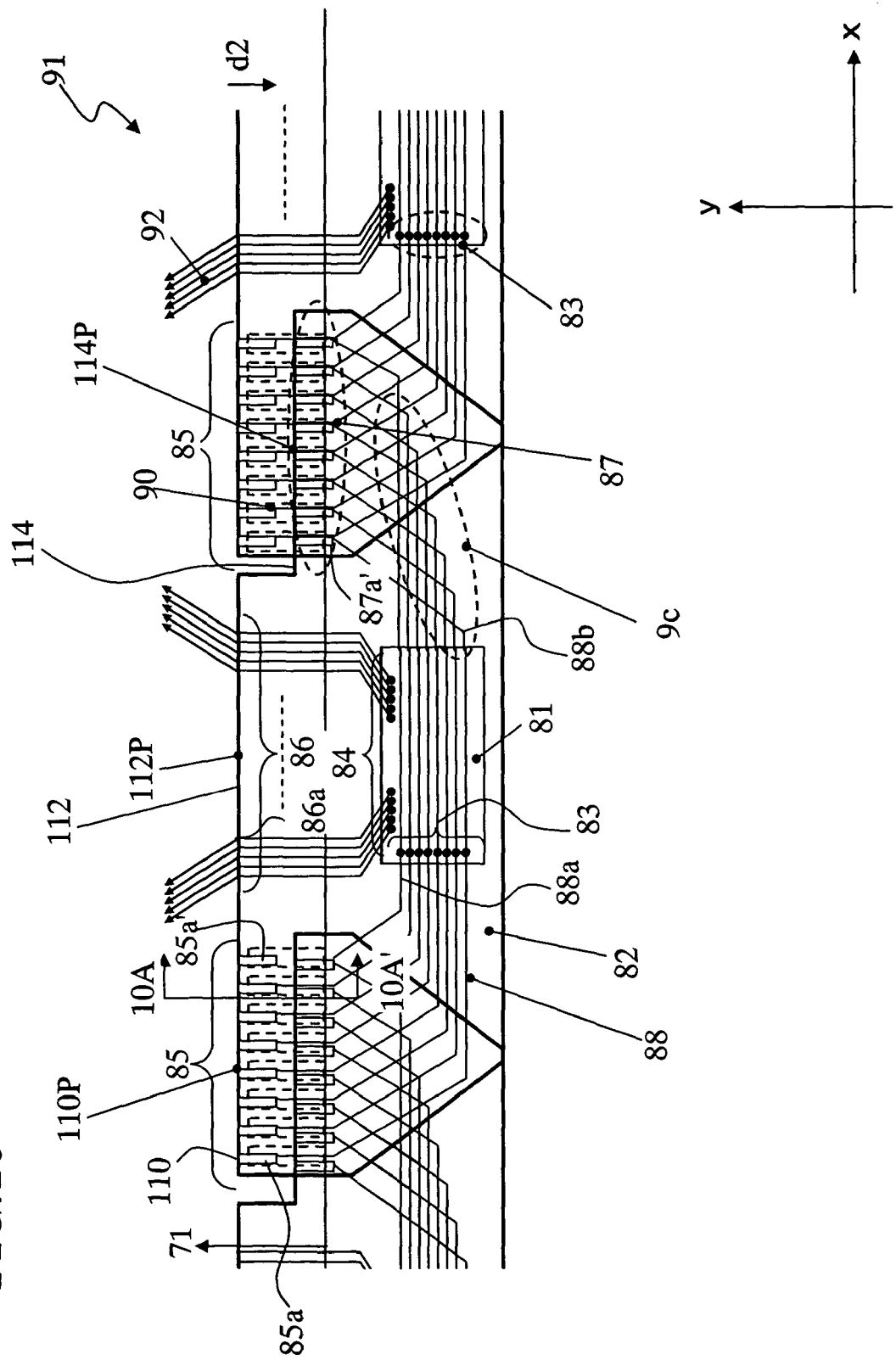
FIG. 10 is a diagram illustrating a source COF of Preferred Embodiment 2 of the present invention.

A liquid crystal module of Preferred Embodiment 2 includes a plurality of source COFs 91 as illustrated in FIG. 10 attached to the display panel 71. The plurality of source COFs 91 are attached to the source terminal region 78 of the display panel 71 while being arranged adjacent to one another in the x direction. The source COF 91 will now be described with reference to FIG. 10 and FIG. 11. Note that components having substantially the same function as those of Preferred Embodiment 1 will be denoted by the same reference numerals and will not be further described below.

As illustrated in FIG. 10, the source COF 91 includes the first terminal section 85, the second terminal section 86 and the third terminal section 87, which are arranged in this order in the x direction. The termination directions of the first terminal section 85, the second terminal section 86 and the third terminal section 87 are all the y direction which crosses the x direction. The first terminal section 85, the second terminal section 86 and the third terminal section 87 includes the plurality of first terminals 85a, the plurality of second terminals 86a and the plurality of third terminals 87a, respectively, which are all arranged next to each other in the x direction.

Moreover, the distance d1 in the y direction between the midpoint 112p of the second reference line 112 and the midpoint 110P of the first reference line 110 is different from the distance d2 in the y direction between the midpoint 112P of the second reference line 112 and the midpoint 114P of the third reference line 114. The first reference line 110 and the second reference line 112 are co-linear with each other extending in the x direction, and the distance d1 is zero. The third reference line 114 is located below the second reference line 112 in the −y direction, and thus the value of d2 is negative. As described above, in the source COFs 91, the first terminal section 85 and the third terminal section 87 are asymmetric with each other about a center line therebetween that is parallel to the y direction.

In the source COFs 91, the termination direction of the first terminal section 85 and the termination direction of the third terminal section 87 are both the +y direction, whereby the COF lines 88 do not need to be routed into the display panel 71 as in the source COF 73 of Preferred Embodiment 1. Therefore, the terminal area will not increase as in the liquid crystal module of Preferred Embodiment 1.

In the source COF 91, unlike in the source COF 73, the COF lines 88 need to cross over one another. On the left side of the driving circuit 81 in the source COFs 91, the COF lines 88 are connected respectively to the plurality of first terminals 85a so that those COF lines 88 that are closer to the second reference line 112 are connected to those first terminals 85a that are closer to the driving circuit 81, with one COF line 88 that is closest to the second reference line 112 (denoted as 88a in FIG. 10) being connected to one first terminal 85a that is closest to the driving circuit 81 (denoted as 85a' in FIG. 10). Therefore, these COF lines 88 do not need to cross over one another. On the right side of the driving circuit 81, the COF lines 88 are connected respectively to the plurality of third terminals 87a so that those COF lines 88 that are farther away from the second reference line 112 are connected to those third terminals 87a that are closer to the driving circuit 81, with one COF line 88 that is farthest away from the second reference line 112 (denoted as 88b in FIG. 10) being connected to one third terminal 87a that is closest to the driving circuit 81 (denoted as 87a' in FIG. 10). Therefore, these COF lines 88 need to cross over one another. The crossover of the COF lines 88 (denoted as 9c in FIG. 10) can be realized by, for example, using a two-layer structure (double-sided Cu-foil COF) for the COF lines 88. The crossover 9c may alternatively be realized by using a jumper chip, or other suitable structure.

The source COFs 91 as described above are attached to the display panel 71 while being arranged so that each source COF 91 overlaps with adjacent source COFs 91, as illustrated in FIG. 10, thereby obtaining the liquid crystal panel of Preferred Embodiment 2.

Figure 11:
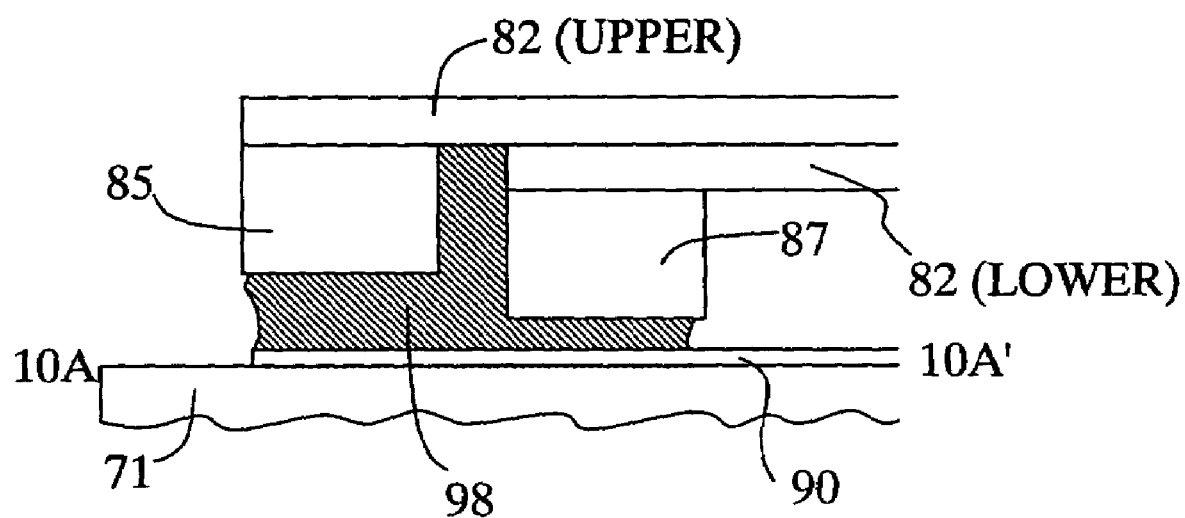
FIG. 11 is a cross-sectional view taken along line 10A-10A' of FIG. 10.

FIG. 11 is a cross-sectional view taken along line 10A-10A' of FIG. 10, schematically illustrating the connection between two adjacent source COFs 91.

Where the plurality of source COFs 91 are attached to the display panel 71, adjacent COFs 91 are arranged so that the first terminal section 85 of one COF 91 overlaps with the third terminal section 87 of the other COF 91. Therefore, the interval between the first terminal section 85 and the panel terminal 90 is larger than the interval between the third terminal section 87 and the panel terminal 90 by the thickness of the substrate 82, as illustrated in FIG. 11. When the overlying COF 91 is press-bonded onto the display panel 71, a step is formed corresponding to the thickness of the substrate of the underlying COF 91. Therefore, a sufficient electrical connection between the first terminal section 85 and the panel terminals 90 may not be obtained, when a press bonding tool having a flat and rigid surface is used. However, a desirable connection can be obtained by, for example, placing a buffer material (silicone rubber) having a thickness of about 0.2 nm under the press bonding tool so that the display panel 71 or the COF 91 are allowed to deform sufficiently.

In the liquid crystal module of Preferred Embodiment 2, as in Preferred Embodiment 1, the first terminals and the third terminals of adjacent COFs can be connected to each other with a sufficiently small connection resistance on the panel terminals, whereby it is possible to minimize the connection resistance between these terminals. Thus, deterioration of the driving power supply/signal received through the FPC is reliably prevented, whereby a large number of COFs can be driven normally without making a direct connection to an external circuit board.

Preferred Embodiment 3

Figure 12:
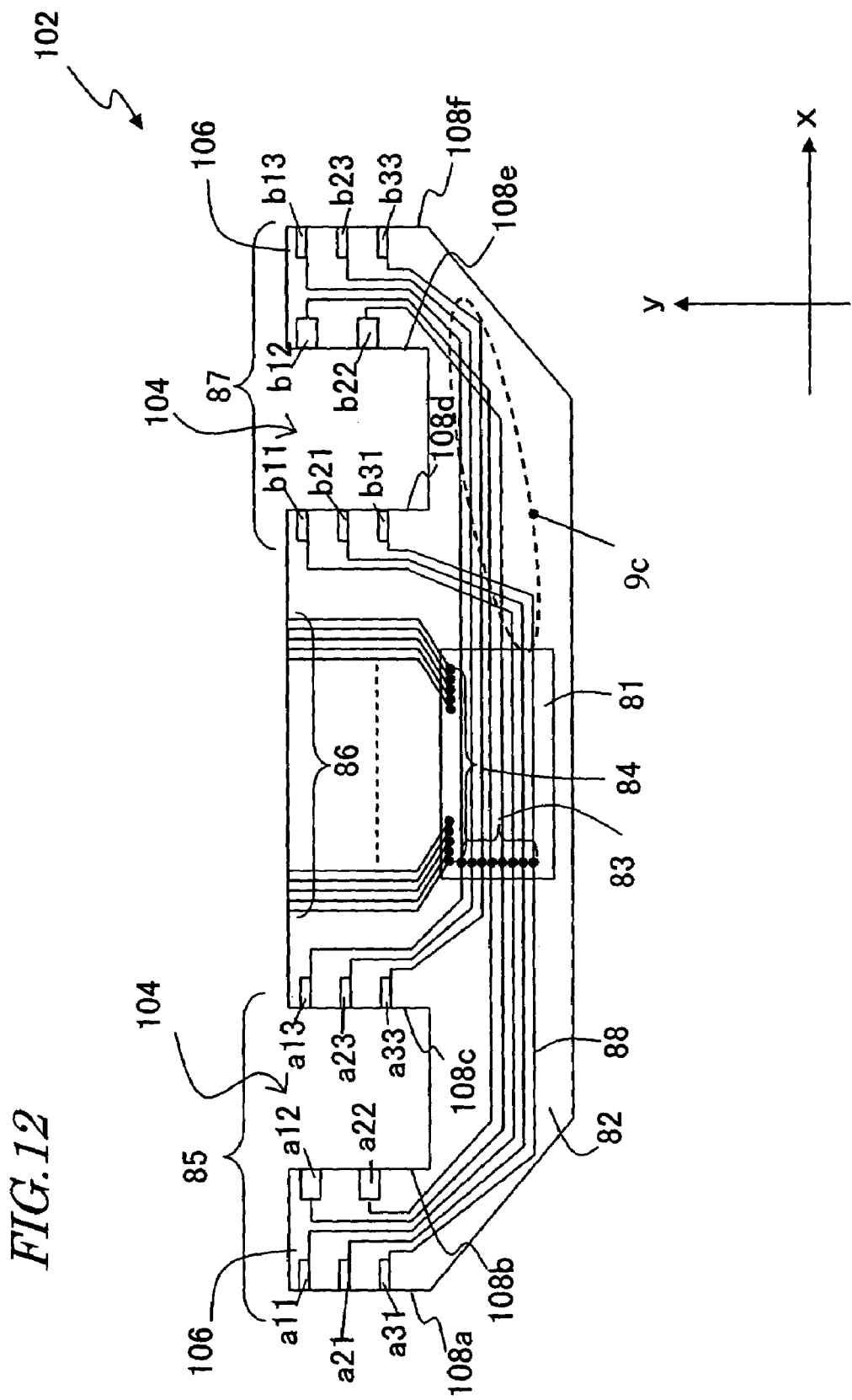
FIG. 12 is a diagram illustrating a source COF of Preferred Embodiment 3 of the present invention.

A liquid crystal module of Preferred Embodiment 3 includes a plurality of source COFs 102 as illustrated in FIG. 12 attached to the display panel 71. The plurality of source COFs 102 are attached to the source terminal region 78 of the display panel 71 while being arranged adjacent to one another in the x direction. The source COF 102 will now be described with reference to FIG. 12 and FIG. 13. Note that components having substantially the same function as those of Preferred Embodiment 1 will be denoted by the same reference numerals and will not be further described below.

As illustrated in FIG. 12, the substrate 82 of the source COF 102 includes recessed portions 104 and protruding portions 106 along the edge of the substrate 82 along which the first terminal section 85 and the third terminal section 87 are arranged. The recessed portions 104 and the protruding portions 106 include sides 108*a* to 108*f* that are parallel to the y direction which crosses the x direction. The first terminal section 85, the second terminal section 86 and the third terminal section 87 include a plurality of first terminals, a plurality of second terminals and a plurality of third terminals, respectively. In FIG. 12, the plurality of first terminals are denoted by the reference numerals a11, a12, a13 . . . a33. Similarly, the plurality of third terminals are denoted by the reference numerals b11, b12, b13 . . . b33.

Each of the plurality of first terminals and the plurality of third terminals includes at least two terminals that are arranged in the x direction. In FIG. 12, for example, the terminals a11, a12 and a13 among the plurality of first terminals are arranged in the x direction, and the terminals b11, b12 and b13 among the plurality of third terminals are arranged in the x direction. Thus, the increase in the width of the COF 102 in the y direction can be suppressed by forming the terminals so that at least two terminals are arranged in the x direction (terminals are arranged adjacent to each other in the y direction at a plurality of positions located along the x direction). Note that the plurality of second terminals are all arranged in the x direction.

Furthermore, the plurality of first terminals and the plurality of third terminals each include at least two terminals that are arranged along the sides 108*a* to 108*f* of the recessed portion 104 and the protruding portion 106 parallel to the y direction. In FIG. 12, the first terminals a11, a21 and a31 are arranged along the side 108*a* parallel to the y direction, the first terminals a12, a22 and a32 along the side 108*b*, and the first terminals a13, a23 and a33 along the side 108*c*. Similarly, the third terminals b11, b21 and b31 are arranged along the side 108*d* parallel to the y direction, the third terminals b12, b22 and b32 along the side 108*e*, and the third terminals b13, b23 and b33 along the side 108*f*.

The termination direction of the second terminal section 86 is the y direction. The termination direction of the first terminal section 85 is the x or −x direction, and that of the third terminal section 87 is also the x or −x direction. Referring to FIG. 12, in the first terminal section 85, the termination direction of the first terminals a12 and a22 is the x direction, and the termination direction of the other first terminals a11, a21, a31, a13, a23 and a33 is the −x direction. Similarly, in the third terminal section 87, the termination direction of the third terminals b12 and b22 is the −x direction, and the termination direction of the other third terminals b11, b21, b31, b13, b23 and b33 is the x direction.

Moreover, the protruding portion 106 along the edge where the first terminal section 85 is provided has such a shape that it can be fitted in the recessed portion 104 along the edge where the third terminal section 87 is provided, while the protruding portion 106 along the edge where the third terminal section 87 is provided has such a shape that it can be fitted in the recessed portion 104 along the edge where the first terminal section 85 is provided.

Figure 13:
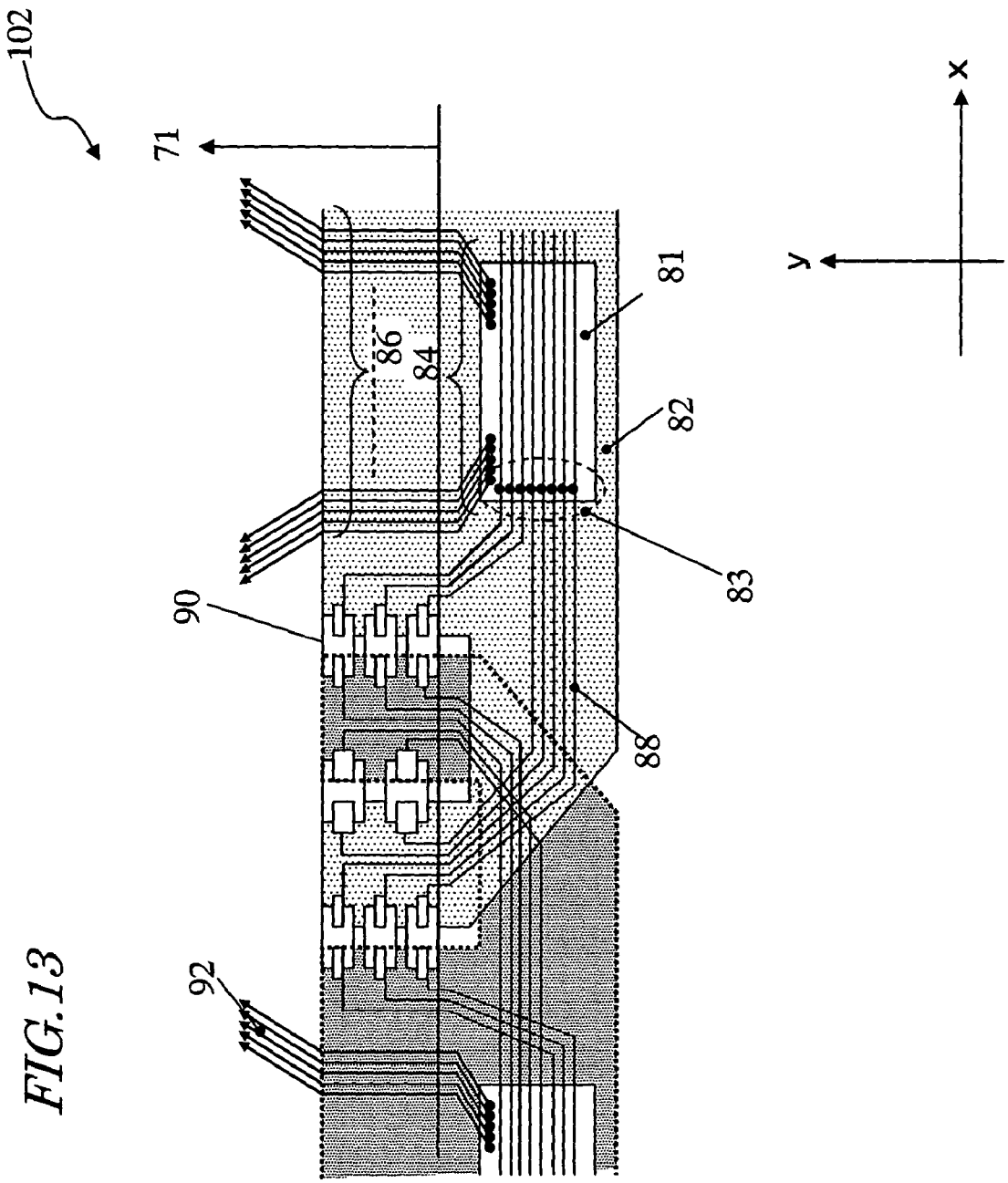
FIG. 13 is a diagram illustrating a source COF of Preferred Embodiment 3 of the present invention.

The source COF 102 as described above is attached to the display panel 71 with the first terminal section 85 thereof being connected to the third terminal section 87 of an adjacent COF 102, as illustrated in FIG. 13. The terminals of the first terminal section 85 are electrically connected to the respective terminals of the third terminal section 87 of an adjacent COF 102 on the panel terminals 90. Specifically, the first terminals all, a21, a31, a12, a22, a13, a23 and a33 are connected to the third terminals b11, b21, b31, b12, b22, b13, b23 and b33, respectively, of an adjacent COF 102.

In the liquid crystal module of Preferred Embodiment 3, as in Preferred Embodiment 1, the first terminals and the third terminals of adjacent COFs can be connected to each other with a sufficiently small connection resistance on the panel terminals, whereby it is possible to minimize the connection resistance between these terminals. Thus, deterioration of the driving power supply/signal received through the FPC is effectively prevented, whereby a large number of COFs can be driven normally without making a direct connection to an external circuit board.

Note that in the source COF 102, as in the source COF 91 of Preferred Embodiment 2, the COF lines 88 need to cross over one another on the substrate 82. The crossover 9*c* of the COF lines 88 may be realized by, for example, using a two-layer structure (double-sided Cu-foil COF) for the COF lines 88, or by using a jumper chip, or suitable structure.

Preferred Embodiment 4

Figure 14:
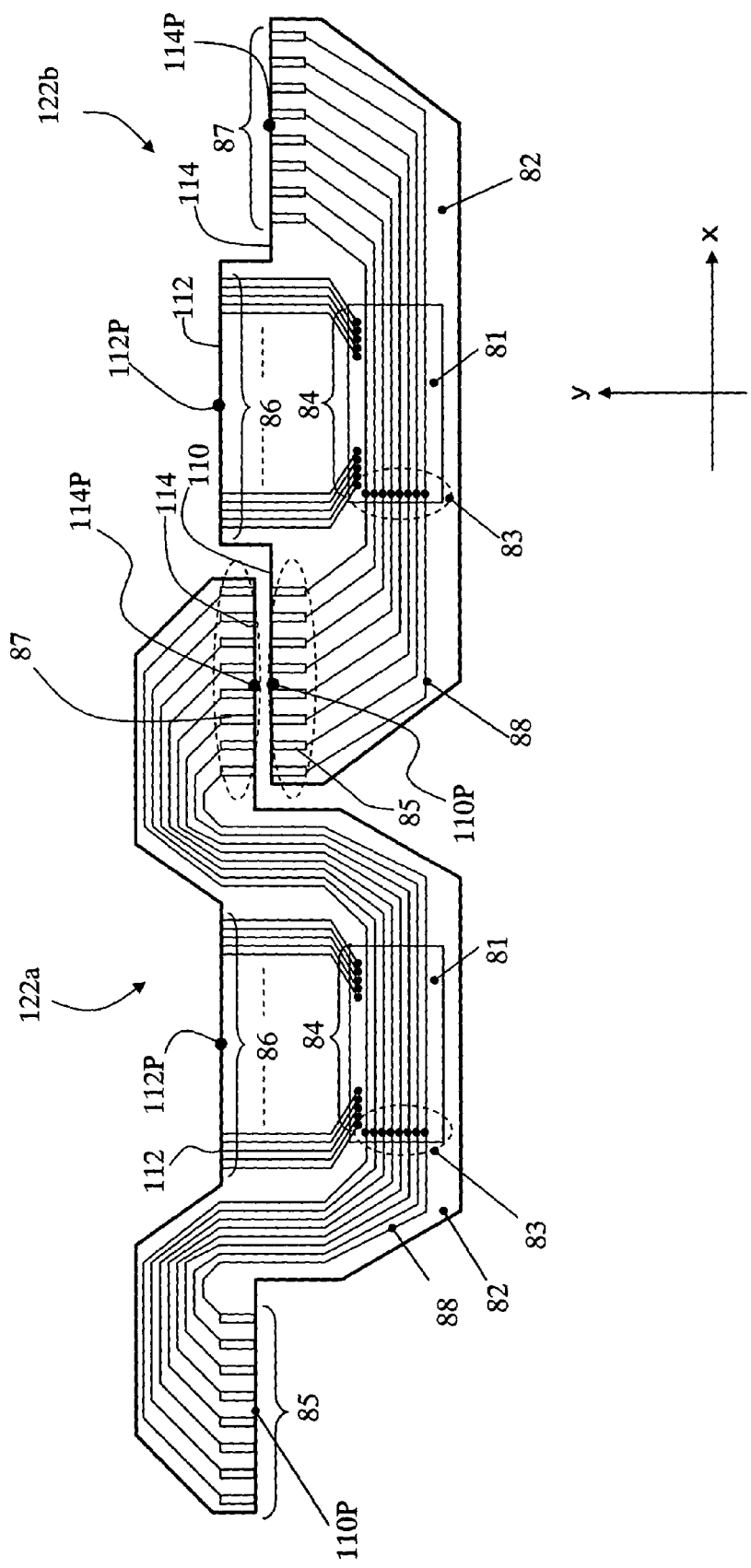
FIG. 14 is a diagram illustrating a source COF of Preferred Embodiment 4 of the present invention.

A liquid crystal module 130 of Preferred Embodiment 4 includes source COFs 122*a* and 122*b* as illustrated in FIG. 14 attached to the display panel 71. The two COFs 122*a* and 122*b* together form a pair, and are attached to the source terminal region 78 of the display panel 71 while being arranged in the x direction.

The source COFs 122*a* and 122*b* will now be described with reference to FIG. 14. Note that components having substantially the same function as those of Preferred Embodiment 1 will be denoted by the same reference numerals and will not be further described below.

Each of the source COFs 122*a* and 122*b* includes the first terminal section 85, the second terminal section 86 and the third terminal section 87, which are arranged in this order in the x direction.

In each of the source COFs 122*a* and 122*b*, the distance d1 in the y direction between the midpoint 112P of the second reference line 112 and the midpoint 110P of the first reference line 110 is equal to the distance d2 in the y direction between the midpoint 112P of the second reference line 112 and the midpoint 114P of the third reference line 114, and the first terminal section 85 and the third terminal section 87 are axisymmetric with each other about a center line therebetween that is parallel to the y direction.

The source COF 122*a* and the source COF 122*b* differ from each other with respect to the termination direction of the first terminal section 85 and the termination direction of the third terminal section 87. In the source COF 122*a*, the termination direction of the first terminal section 85 and that of the third terminal section 87 are both the −y direction. In the source COF 122*b*, the termination direction of the first terminal section 85 and that of the third terminal section 87 are both the y direction.

The COF 122*a* and the COF 122*b* as described above are attached to the source terminal region 78 of the display panel 71 while being arranged next to each other in the x direction. The third terminal section 87 of the COF 122*a* and the first terminal section 85 of the COF 122*b* are electrically connected to each other with a sufficiently small interval on the panel terminals 90 as in Preferred Embodiment 1. Therefore, it is possible to minimize the connection resistance between adjacent terminals as in Preferred Embodiment 1. Thus, deterioration of the driving power supply/signal received through the FPC can be effectively prevented, whereby a large number of COFs can be driven normally without making a direct connection to an external circuit board.

In the liquid crystal module of the present preferred embodiment, unlike in the liquid crystal modules of Preferred Embodiments 2 and 3, adjacent source COFs do not need to overlap with each other when they are attached to the display panel 71. Therefore, when a defect occurs in one source COF after a plurality of source COFs are attached to the display panel 71, the defective source COF can easily be replaced.

Thus, the above-described preferred embodiments of the present invention provide an electronic module using a PWB-free structure and a driving circuit board therefor, in which increases in the resistance value are prevented and increases in the size of the terminal region is prevented.

Figure 16:
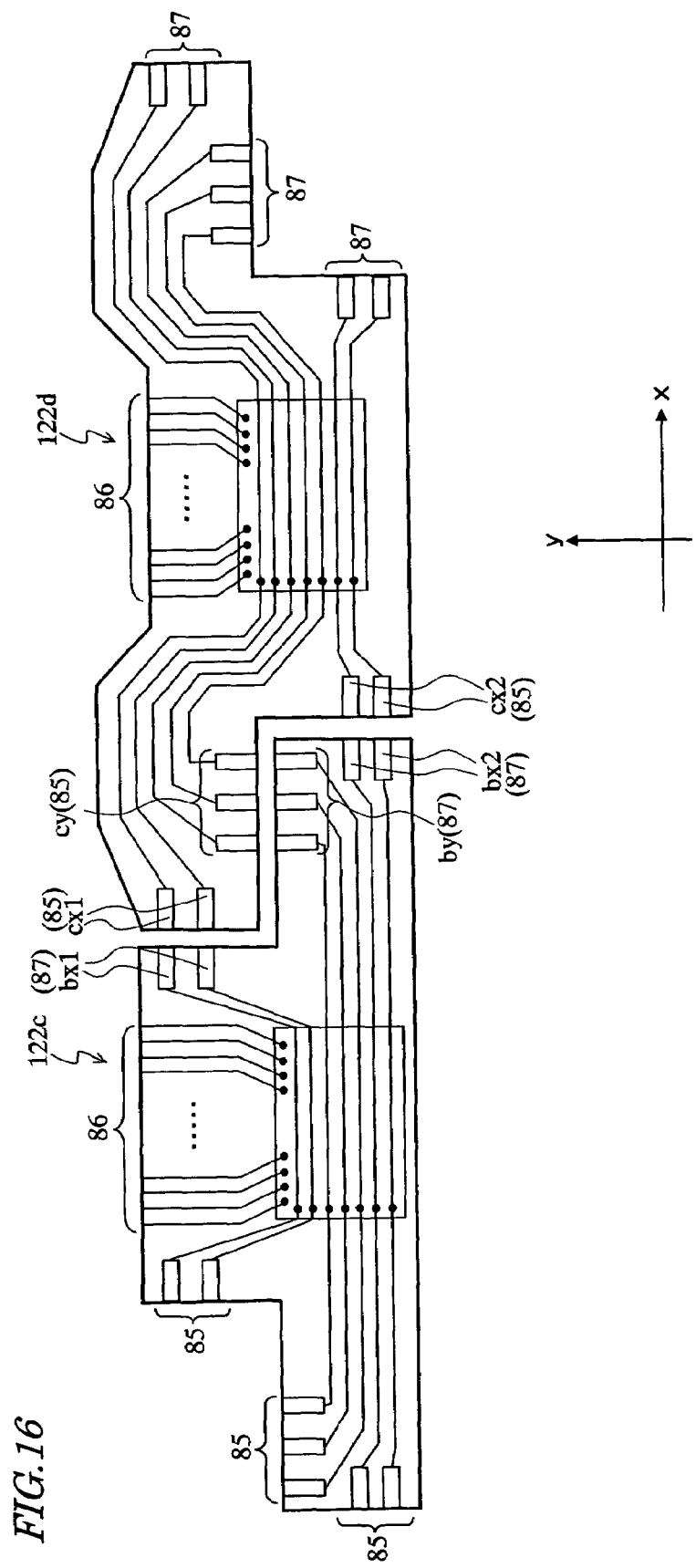
FIG. 16 is a diagram illustrating a source COF of a modification of Preferred Embodiment 4 of the present invention.

Next, a variation of the driving circuit board used in the liquid crystal module 130 of Preferred Embodiment 4 will be described. FIG. 16 illustrates a source COF 122c and a source COF 122d used in the liquid crystal module 130. The COFs 122c and 122d, defining a pair of COFs, are attached to the source terminal region 78 of the display panel 71 while being arranged adjacent to each other in the x direction.

Figure 15:
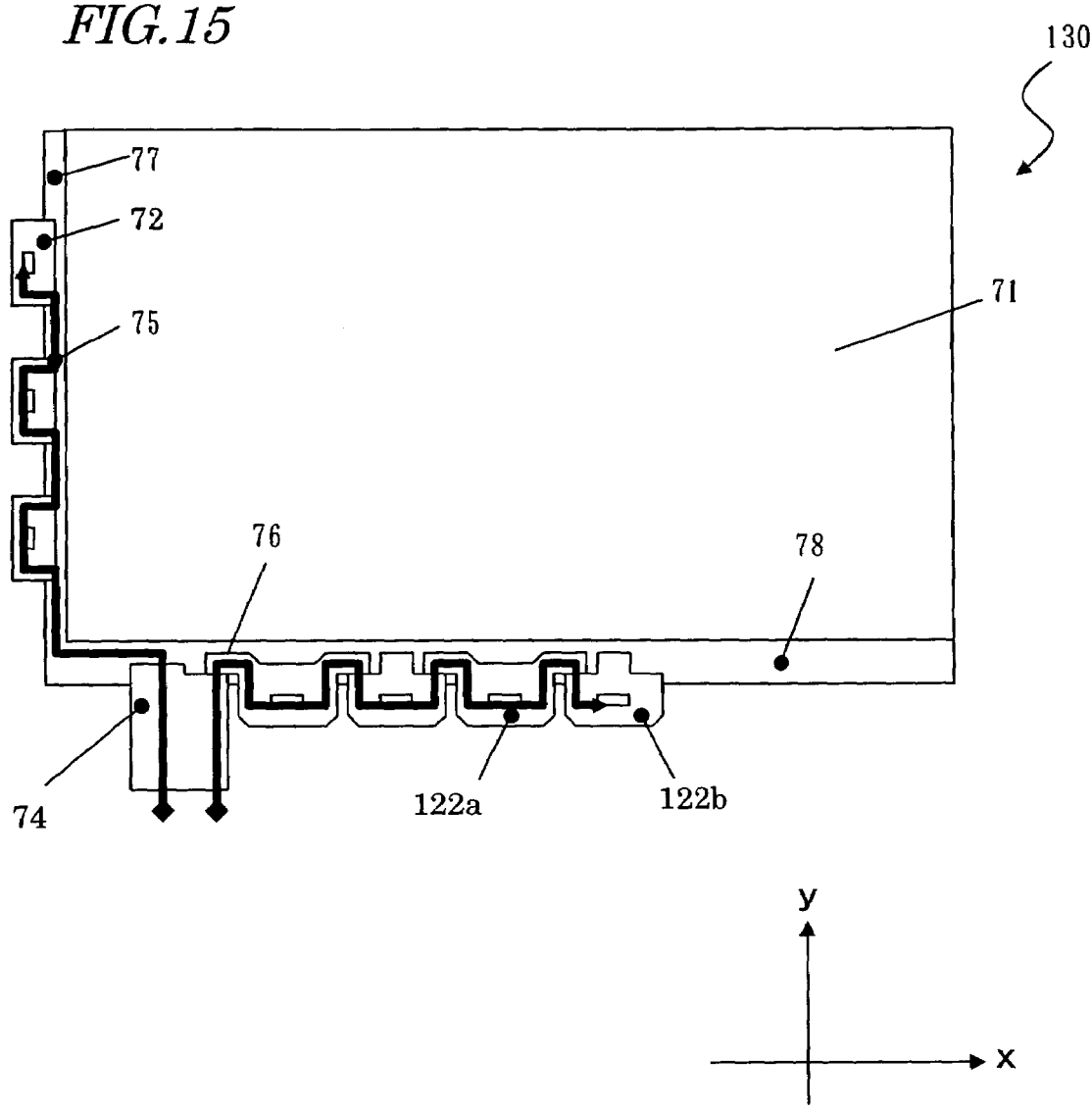
FIG. 15 is a diagram illustrating a source COF of Preferred Embodiment 4 of the present invention.

With the source COFs 122a and 122b illustrated in FIG. 15, the output terminals (the third terminals 87) of the source COF 122a and the input terminals (the first terminals 85) of the source COF 122b are facing each other only in the y direction. In contrast, with the source COFs 122c and 122d illustrated in FIG. 16, the output terminals (the third terminals 87) of the source COF 122c and the input terminals (the first terminals 85) of the source COF 122d are facing each other both in the x direction and in the y direction.

The source COFs 122c and 122d will now be described in greater detail.

The third terminal section 87 of the source COF 122c includes terminals bx1 and bx2 terminating in the x direction, and terminals by terminating in the y direction. It should be noted that terminals bx1 and bx2 and by of FIG. 16 correspond to terminals 87 of FIG. 16. The first terminal section 85 of the source COF 122d includes terminals cx1 and cx2 terminating in the −x direction, and terminals cy terminating in the −y direction. It should be noted that terminals cx1 and cx2 and cy of FIG. 16 correspond to terminals 85 of FIG. 16. The terminals bx1 and bx2 of the source COF 122c are electrically connected to the terminals cx1 and cx2, respectively, of the source COF 122d via the panel terminals 90 formed on the display panel 71. Moreover, the terminals by of the source COF 122c are electrically connected to the terminals cy of the source COF 122d via the panel terminals 90 formed on the display panel 71.

Therefore, with the source COFs 122c and 122d, the third terminals 87 of the source COF 122c and the first terminals 85 of the source COF 122d are facing each other both in the x direction and in the y direction.

In each of the source COFs 122c and 122d, the first terminal section 85 and the third terminal section 87 are axisymmetric with each other about a center line therebetween that is parallel to the y direction. Therefore, the first terminal section 85 of the source COF 122c and the third terminal section 87 of the source COF 122d will not be described below.

While three or more driving circuit boards (e.g., source COFs) are attached to the liquid crystal module in the description above, the present invention is not limited to this, as long as there are at least two driving circuit boards. Specifically, two source COFs as illustrated in FIG. 17 can be used, for example.

Figure 17:
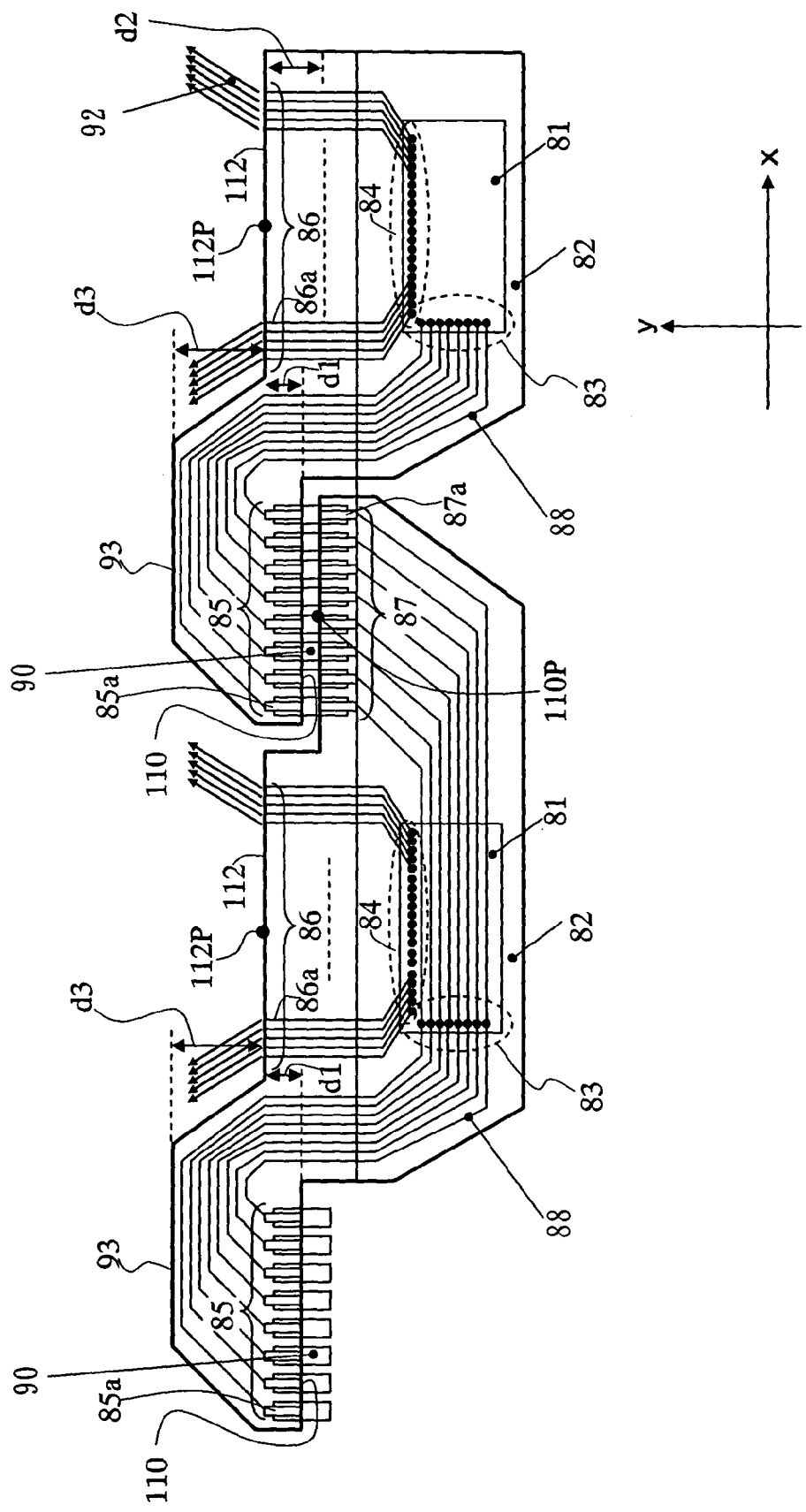
FIG. 17 is a diagram illustrating a source COF of another Preferred Embodiment of the present invention.

The left-side source COF illustrated in FIG. 17 is provided upstream (closer to the input FPC 74) in the source terminal region 78 of the display panel 71 with respect to the right-side source COF. The left-side source COF of FIG. 17 is the same as the source COF of Preferred Embodiment 1 illustrated in FIG. 7A The right-side source COF is different from the left-side source COF in that the COF lines 88 of the right-side source COF extend only up to the input terminals 83 of the driving circuit 81, and that the right-side source COF does not include lines and terminals (the third terminals 87a) for passing the driving power supply/signal to another source COF.

An advantageous effect of preferred embodiments of the present invention that a driving power supply/signal can be transmitted, with minimal deterioration, successively through a plurality of driving circuit boards is more pronounced as the number of driving circuit boards is larger. Nevertheless, advantageous effects of preferred embodiments of the present invention can be obtained as long as at least two driving circuit boards are provided.

Next, an electronic module according to the second aspect of preferred embodiments of the present invention will be described. A feature of the electronic module according to the second aspect is that the driving circuit and the transfer lines are provided on physically separate substrates. As compared with the electronic module according to the first aspect where the driving circuit and the transfer lines are provided on one driving circuit board, which is provided on a single substrate, the electronic module according to the second aspect of preferred embodiments of the present invention provides an advantageous effect that even where pattern formation with a higher definition is required, the driving circuit board can be made small, thereby achieving a low production cost.

One preferred embodiment of the electronic module according to the second aspect of the present invention will now be described.

Figure 18:
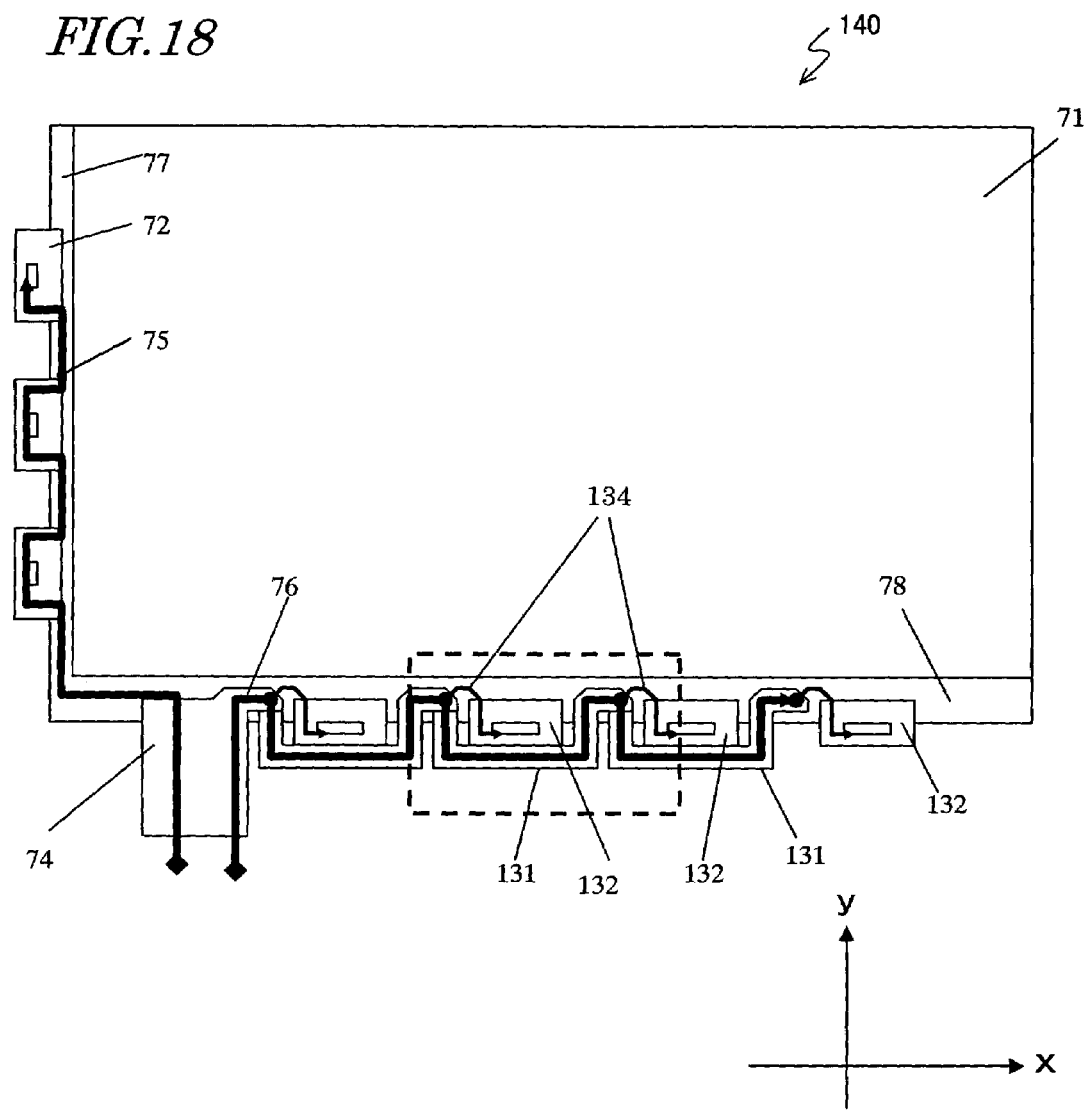
FIG. 18 is a diagram schematically illustrating a liquid crystal module according to a second aspect of preferred embodiments of the present invention.

FIG. 18 is a diagram schematically illustrating a liquid crystal module 140 as an electronic module according to the second aspect of preferred embodiments of the present invention. In the liquid crystal module 140, source COFs (driving circuit boards) 132 each including a driving circuit, and transfer FPCs (wiring boards) 131 each including transfer lines are attached to the source terminal region 78 of the display panel 71. The liquid crystal module 140 is substantially different from Preferred Embodiments 1 to 4 in that the driving circuit and the transfer lines are provided on physically separate substrates.

Figure 19:
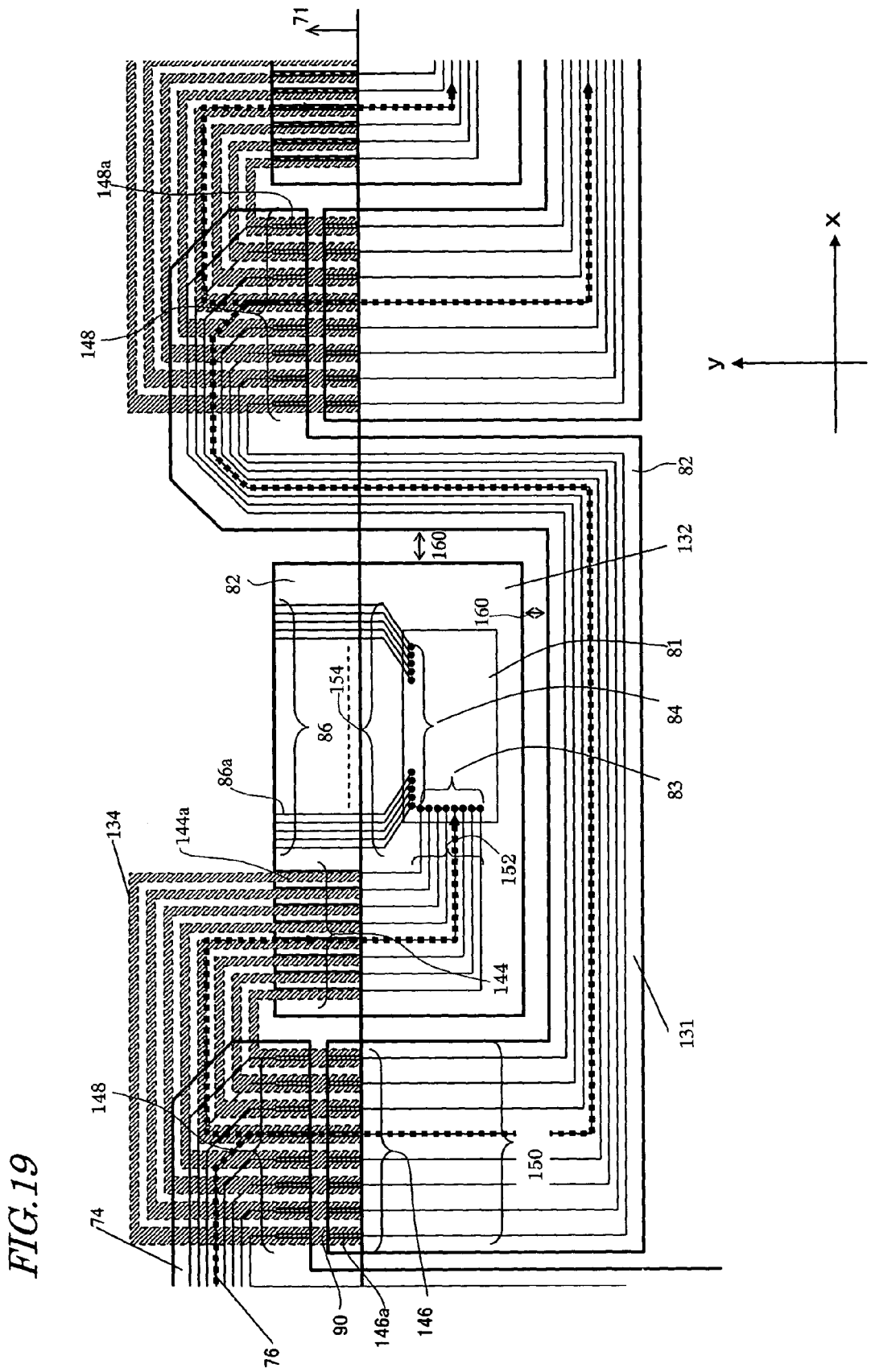
FIG. 19 is an enlarged view of a broken line section in FIG. 18.

FIG. 19 is an enlarged view of a broken line section in FIG. 18. The liquid crystal module 140 will now be described in greater detail with reference to FIG. 18 and FIG. 19.

The display panel 71 of the liquid crystal module 140 includes a plurality of TFTs (not shown), a plurality of source lines (not shown) connected respectively to the TFTs, a plurality of gate lines (not shown) connected respectively to the TFTs, a plurality of panel terminals 90 provided in the source terminal region 78, and a plurality of panel lines 134 electrically connected to the panel terminals 90.

The liquid crystal module 140 further includes the input FPC 74, a plurality of source COFs (driving circuit boards) 132 and a plurality of transfer FPCs (wiring boards) 131, which are attached to the source terminal region 78 of the display panel 71, and a plurality of gate TCPs 72, which are attached to the gate terminal region 77 of the display panel 71. The input FPC 74 is connected to an external circuit board (not shown). The boards 74, 131, 132 and 72 are attached to the display panel 71 via ACF, for example.

In the liquid crystal module 140, the connection between the display panel 71 and the source COFs 132 in the source terminal region 78 and the connection between the display panel 71 and the gate TCPs 72 in the gate terminal region 77 are made with a PWB-free structure. Particularly, an electrical connection structure that is characteristic of preferred embodiments of the present invention is used for the source terminal region 78.

The source driving power supply/signal 76 received through the input FPC 74 is supplied to the source COFs 132 (the driving circuits 81) via the transfer FPCs 131. The gate driving power supply/signal 75 received through the input FPC 74 successively propagates through the gate TCPs 72 adjacent to one another. Note that the input FPC 74 may alternatively be attached to the gate terminal region 77, or at least one of the transfer FPCs 131 and the gate TCPs 72 may function also as the input FPC 74.

The source COF 132 includes the film-shaped substrate 82, the driving circuit 81 provided on the substrate 82, an input line terminal section 144 and an output line terminal section 86. The input line terminal section 144 includes a plurality of input line terminals 144a, and the output line terminal section 86 includes a plurality of output line terminals 86a. The input line terminals 144a and the output line terminals 86a are arranged in the x direction, and the termination direction thereof is the +y direction. The driving circuit 81 includes a plurality of input terminals 83 and a plurality of output terminals 84. The input terminals 83 of the driving circuit 81 and the input line terminals 144a are electrically connected to each other via lines 152. The output terminals 84 of the driving circuit 81 and the output line terminals 86a are electrically connected to each other via lines 154. The output terminals 84 of the driving circuit 81 are electrically connected to the signal lines (e.g., source lines; not shown) of the display panel 71 via the output line terminals 86a.

The transfer FPC 131 includes an upstream terminal section 146, a downstream terminal section 148, and transfer lines 150. The upstream terminal section 146 includes a plurality of upstream terminals 146a, and the downstream terminal section 148 includes a plurality of downstream terminals 148a. The upstream terminals 146a and the downstream terminals 148a are arranged next to each other, respectively, in the x direction at the upstream terminal section 146 and at the downstream terminal section 148, respectively. The termination direction of the upstream terminals 146a is the +y direction, and the termination direction of the downstream terminals 148a is the −y direction. The transfer lines 150 connect the upstream terminals 146a with the downstream terminals 148a.

The upstream terminal section 146, the input line terminal section 144, the output line terminal section 86 and the downstream terminal section 148 are arranged in this order in the x direction.

The transfer lines 150 provided on the transfer FPC 131 are electrically connected to the panel terminals 90 on the display panel 71 via the downstream terminals 148a. The transfer lines 150 are electrically connected to the panel lines 134 via the panel terminals 90, and are electrically connected to the upstream terminal section 146 of an adjacent transfer FPC 131.

As described above, in the liquid crystal module 140 of the present preferred embodiment, the driving circuit 81 and the transfer lines 150 for successively transferring the source driving power supply/signal 76 through the plurality of source COFs 132 (the driving circuits 81) are provided respectively on the source COF 132 and the transfer FPC 131, which are provided on physically separate substrates. In contrast, in the liquid crystal modules of Preferred Embodiments 1 to 4, the driving circuit 81 and the COF lines (transfer lines) 88 for successively transferring the source driving power supply/signal 76 through adjacent source COFs (the driving circuits 81) are provided on the same source COF.

A source COF is provided with a driving circuit (e.g., IC), and a substantially larger number of output signal lines, as compared with the number of input signal lines, are connected to the driving circuit. Therefore, a source COF is designed with a minute wiring pitch (e.g., about 50 µm or less) and is a very expensive component. In contrast, an FPC, which includes the same number of transfer lines as the number of input signal lines, is designed with a larger wiring pitch than that of a source COF as described above, and is an inexpensive component. While the source COFs used in Preferred Embodiments 1 to 4 include the COF lines 88 in addition to the driving circuit, the source COF 132 used in the present preferred embodiment does not include transfer lines. Therefore, the source COF 132 used in the present preferred embodiment can be made in a smaller size, and is thus less expensive, than the source COFs used in Preferred Embodiments 1 to 4. Moreover, as described above, a transfer FPC is less expensive than a source COF. Therefore, by using the combination of a source COF and an FPC as in the present preferred embodiment, the total production cost can be reduced as compared with Preferred Embodiments 1 to 4.

Moreover, while the source COF 132 has a minute wiring pitch, the source COF 132 used in the present preferred embodiment has a smaller size than the source COFs of Preferred Embodiments 1 to 4, whereby the source COF 132 of the present preferred embodiment can easily be positioned with respect to the display panel 71.

In the liquid crystal modules of Preferred Embodiments 1 to 4, the source driving power supply/signal 76 is successively transferred through a plurality of source COFs by electrically connecting the source COFs by using the panel terminals on the display panel. As a result, the source COFs are closely arranged in a certain portion of the source terminal region 78 of the display panel 71. When the source COFs are closely arranged in a certain portion of the terminal region 78, long signal lines are required for connecting the TFTs on the display panel 71, which are electrically connected to the output line terminals (second terminals) 86a, to the output line terminals 86a. In contrast, in the liquid crystal module 140 of the present preferred embodiment, the transfer lines 150 are provided on the FPC, which is separate from the source COF. Since an FPC is less expensive than a COF, the source COFs can be arranged relatively freely by optimally adjusting the size of the transfer FPCs 131. Therefore, the source COFs can be arranged so as to reduce the length of the source lines, for example, while avoiding an increase in the production cost.

How the source driving power supply/signal 76 is transferred will now be described in greater detail.

As illustrated in FIG. 19, the panel terminals 90 and the panel lines 134 electrically connected to the panel terminals 90 are formed in the source terminal region 78 of the display panel 71. The panel terminals 90 and the panel lines 134 are formed integrally with the same conductive material. ACF is applied to predetermined portions of the area where the conductive material is formed. Herein, the areas where ACF is applied to the surface are defined as the panel terminals 90, and the areas where ACF is not applied are defined as the panel lines 134.

The panel terminals 90 are electrically connected to the upstream terminals 146a of the transfer FPCs 131 via ACF. The panel terminals 90 are electrically connected further to the input line terminals 144a of an adjacent source COF 132 via ACF and the panel lines 134.

Figure 20:
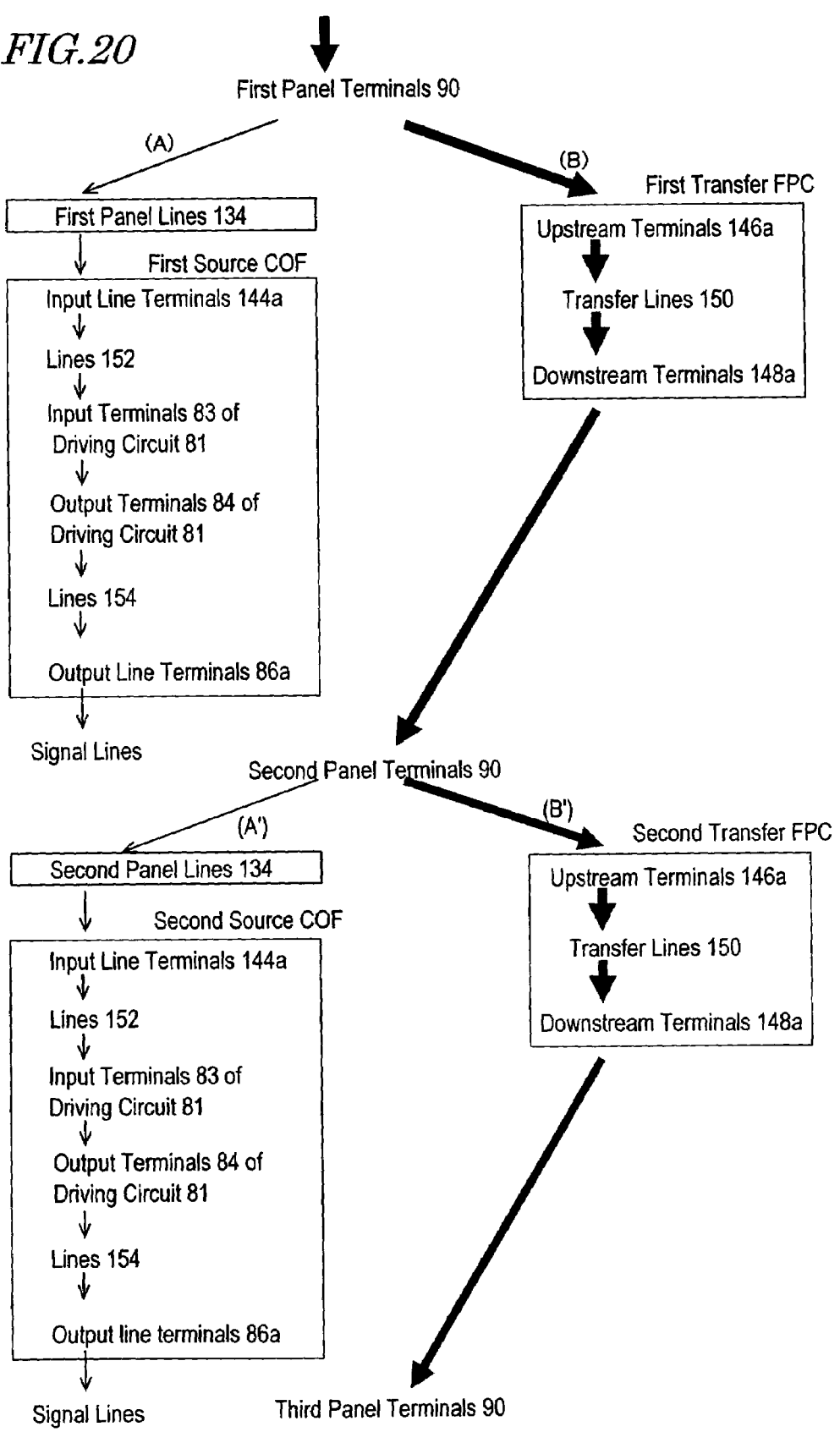
FIG. 20 is a chart illustrating the transfer path of the source driving power supply/signal according to the preferred embodiment of the present invention shown in FIG. 18.

FIG. 20 is a chart illustrating the transfer path of the source driving power supply/signal 76 of the present preferred embodiment (FIG. 18 and FIG. 19).

With the structure of the present preferred embodiment, the transfer path of the source driving power supply/signal 76 branches from the panel terminals 90 into a transfer path extending to the panel lines 134 and another transfer path extending to the upstream terminals 146a of the transfer FPC 131.

In the following description, it is assumed that a first COF 132, a second COF 132, a third COF 132, . . . , are arranged in this order along the x direction from the upstream side (closer to the input FPC 74) to the downstream side. It is also assumed that a first transfer FPC 131, a second transfer FPC 131, a third transfer FPC 131, . . . , are arranged in this order in the x direction from the upstream side to the downstream side. The panel terminals for transferring a signal to the first source COF 132 and the first transfer FPC 131 are defined as the first panel terminals 90, and the panel terminals for transferring a signal to the second source COF 132 and the second transfer FPC 131 are defined as the second panel terminals 90. The panel terminals for transferring a signal to the first source COF 132 are defined as the first panel lines 134, and the panel terminals for transferring a signal to the second source COF 132 are defined as the second panel lines 134.

As illustrated in FIG. 20, the transfer path (A) branching from the first panel terminals 90 to the first panel lines 134 extends from (1) the input line terminals 144a of the first source COF 132 to (2) the lines 152 of the first source COF 132, (3) the input terminals 83 of the driving circuit 81 of the first source COF 132, (4) the output terminals 84 of the driving circuit 81 of the first source COF 132, (5) the lines 154 of the first source COF 132, (6) the output line terminals 86a of the first source COF 132, and then (7) the signal lines of the display panel 71.

On the other hand, as illustrated in FIG. 20, the transfer path (B) branching from the first panel terminals 90 to the upstream terminals 146a of the first transfer FPC 131 extends from (1) the transfer lines 150 to (2) the downstream terminals 148a of the first transfer FPC 131, and then (3) the second panel terminals 90 provided upstream of the first panel terminals 90. Then, the transfer path (B) branches into the transfer path (A') extending to (4) the second panel lines 134, and the transfer path (B') extending to (4) the upstream terminals 146a of the second transfer FPC 131 adjacent to the first transfer FPC 131. The above described progression of transfer paths A and B, A' and B', and so on, from the first panel terminals 90, the second panel terminals 90, third panel terminals 90 and subsequent panel terminals 90 continues as is shown in FIG. 20.

In the transfer path (B), (2) the downstream terminals 148a of the first transfer FPC 131 and (4) the upstream terminals 146a of the second transfer FPC 131 are electrically connected to each other all by (3) the second panel terminals 90 formed on the display panel 71. Thus, the downstream terminals 148a of one transfer FPC 131 and the upstream terminals 146a of an adjacent transfer FPC 131 are electrically connected to each other with a sufficiently small connection resistance. Therefore, deterioration of a signal is unlikely to occur along the transfer path extending from the first transfer FPC 131 to the second transfer FPC 131.

The panel lines 134, which are more prone to signal deterioration than the panel terminals 90, are used along the transfer path (A). However, the transfer path (A) runs through the driving circuit 81 of only one source COF 132, but never runs through the driving circuits 81 of at least two source COFs 132. For the first source COF and the second source COF adjacent to the first source COF, the transfer path reaching the driving circuit 81 of the second source COF never runs through the first panel lines 134.

Figure 4:
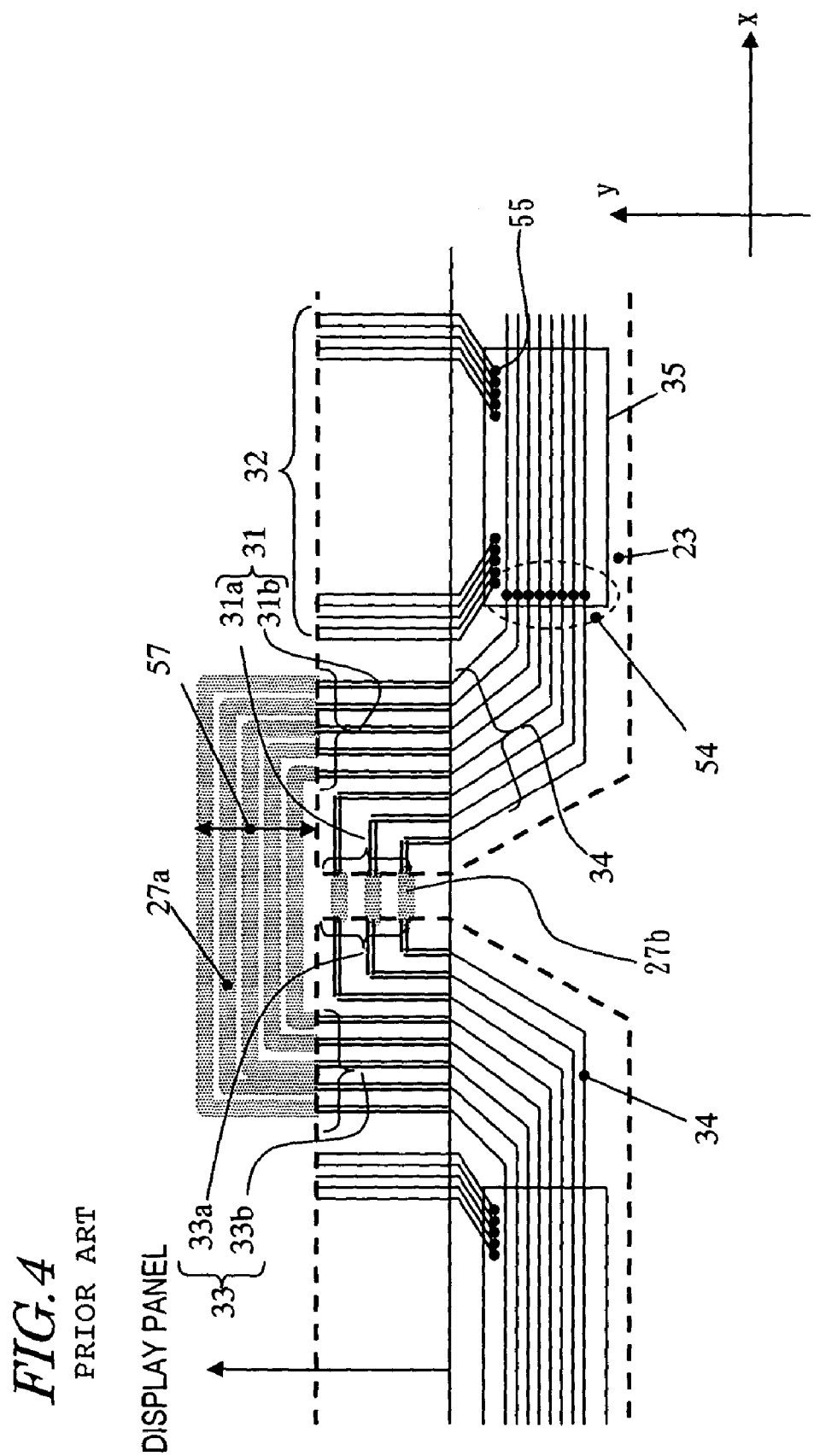
FIG. 4 is an enlarged view of a broken line section in FIG. 2.
Figure 5:
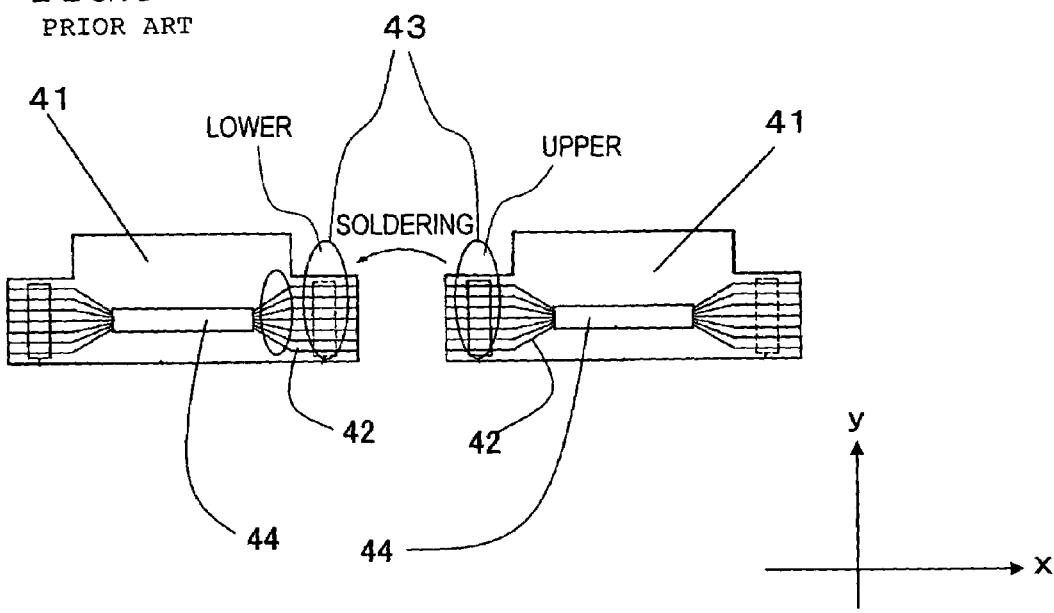
FIG. 5 is a diagram illustrating conventional TCPs.

In contrast, where a plurality of COFs (driving circuits) are serially connected together by panel lines, as in the conventional example illustrated in FIG. 4, deterioration of the driving power supply/signal accumulates to a substantial amount as it travels downstream (away from the input side).

In the present preferred embodiment, the accumulation of deterioration of the source driving power supply/signal 76 received through the input FPC 74 is minimized, whereby the source driving power supply/signal 76 with accumulated deterioration will not be supplied to a downstream source COF 132.

In the description above, the transfer paths (A) and (B) are preferably branching from the panel terminals 90. However, the branching is not limited to this. For example, the transfer paths (A) and (B) may be branching from the downstream terminals 148a.

Figure 21:
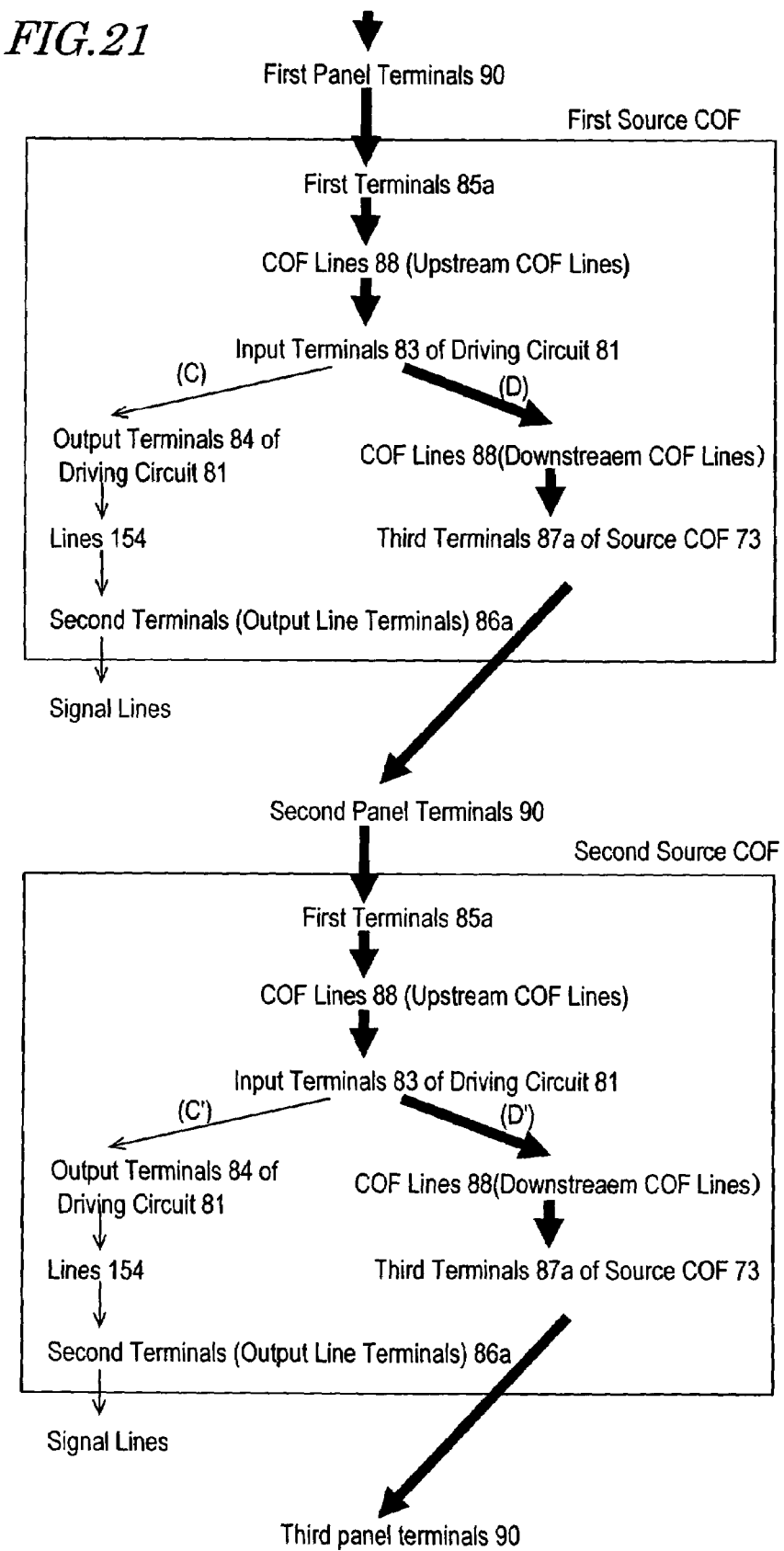
FIG. 21 is a chart illustrating the transfer path of the source driving power supply/signal according to the preferred embodiment of the present invention shown in FIG. 7A.

Next, the transfer path of the source driving power supply/signal 76 of the present preferred embodiment will be compared with that of Preferred Embodiment 1. FIG. 21 illustrates the transfer path of Preferred Embodiment 1 (FIG. 7A).

As illustrated in FIG. 21, the transfer path of Preferred Embodiment 1 branches from the input terminals 83 of the driving circuit 81 into the transfer path (C) extending to the output terminals 84 of the driving circuit 81, and the transfer path (D) extending to the COF lines 88 (downstream COF lines). The transfer path (C) extending to the output terminals 84 of the driving circuit 81, then extends to the lines 154 of the drive circuit, to the second terminals 86a, and then output to the signal lines. The transfer path (D) extending to the COF lines 88 (downstream COF lines) then extends to the third terminals 87a of the source COF 73, the panel terminals 90, and then to the first terminals 85a of the second source COF 73 adjacent to the first source COF 73. In the transfer path of Preferred Embodiment 1, the third terminals 87a of the first source COF 73 and the first terminals 85a of the second source COF 73 are electrically connected to each other via panel terminals, and not via panel lines. The above described progression of transfer paths (C) and (D), and (C') and (D'), and so on, from the first panel terminals 90, the second panel terminals 90, third panel terminals 90 and subsequent panel terminals 90 continues as is shown in FIG. 21.

The present preferred embodiment and Preferred Embodiment 1 share a feature of the present invention in that the panel terminals 90 are used for all the electrical connections between terminals that are necessary when successively transferring the source driving power supply/signal 76 from the upstream side to the downstream side in order to supply the source driving power supply/signal 76 to a plurality of driving circuits 81. In either preferred embodiment, the accumulation of deterioration of the source driving power supply/signal 76 is reliably prevented.

Next, a method for producing the liquid crystal module 140 will be described.

First, the display panel 71 is prepared. ACF, for example, is attached to predetermined portions of the gate terminal region 77 and the source terminal region 78 of the display panel 71. Then, the gate TCPs 72, the FPC 74, the source COFs 132 and the transfer FPCs 131 are positioned with respect to the corresponding terminals formed on the display panel 71, and then pressed onto ACF for temporary fixing, after which they are fixed by thermocompression bonding. Note that the FPC 74, the source COFs 132 and the transfer FPCs 131 are fixed by thermocompression bonding at once.

Through these steps, the liquid crystal module 140 is obtained.

In the example illustrated in FIG. 19, the source COF 132 and the transfer FPC 131 are attached to the display panel 71 with a gap 160 between the source COF 132 and the transfer FPC 131 as viewed from above the display surface of the liquid crystal module 140. However, the arrangement of the source COF 132 and the transfer FPC 131 is not limited to this. For example, the source COF 132 and the transfer FPC 131 may alternatively be arranged with an overlap therebetween as viewed from above the display surface of the liquid crystal module 140, thereby providing an advantageous effect that the module size can be further reduced.

Note that the arrangement direction and the termination direction of the terminals 146a, 144a, 86a and 148a of the liquid crystal module 140 are not limited to those described above. Moreover, the shape of the source COF 132 and that of the transfer FPC 131 are not limited to those described above.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. An electronic module, comprising:
an electronic circuit substrate including a plurality of circuit components, a plurality of signal lines connected respectively to the plurality of circuit components, and a plurality of substrate terminals provided in a terminal region of the electronic circuit substrate; and
a first driving circuit board and a second driving circuit board attached to the terminal region of the electronic circuit substrate while being arranged adjacent to each other in an x direction; wherein
each of the first and second driving circuit boards includes a substrate, a driving circuit provided on the substrate and including a plurality of input terminals and a plurality of output terminals, a first terminal section, a second terminal section, a third terminal section, and a plurality of lines connecting the first terminal section and the third terminal section to each other and the plurality of lines being connected to the plurality of input terminals of the driving circuit;
the first terminal section, the second terminal section and the third terminal section are arranged in this order along the x direction;
the first terminal section, the second terminal section and the third terminal section include a plurality of first terminals, a plurality of second terminals and a plurality of third terminals, respectively, and each of the plurality of first terminals, the plurality of second terminals and the plurality of third terminals includes at least two terminals that are arranged next to each other along the x direction;
the plurality of output terminals of the driving circuit of each of the first driving circuit board and the second driving circuit board are electrically connected to the plurality of signal lines of the electronic circuit substrate via the plurality of second terminals;
the third terminal section of the first driving circuit board and the first terminal section of the second driving circuit board are electrically connected to each other by only the plurality of substrate terminals of the electronic circuit substrate.

2. The electronic module according to claim 1, wherein a connection resistance between the third terminal of the first driving circuit board and the first terminal of the second driving circuit board is about 10 Ω or less.

3. The electronic module according to claim 1, wherein all of the plurality of first terminals, all of the plurality of second terminals and all of the plurality of third terminals are arranged in the x direction.

4. The electronic module according to claim 1, wherein in each of the first driving circuit board and the second driving circuit board:
a termination direction of the second terminal section is a y direction which crosses the x direction; and
one of a termination direction of the first terminal section and a termination direction of the third terminal section is the y direction while the other is a −y direction.

5. The electronic module according to claim 1, wherein, in each of the first driving circuit board and the second driving circuit board, a termination direction of the first terminal section, a termination direction of the second terminal section and a termination direction of the third terminal section are all a y direction which crosses the x direction.

6. The electronic module according to claim 1, wherein in each of the first driving circuit board and the second driving circuit board:
a first reference line, a second reference line and a third reference line are defined along edges of the first terminal section, the second terminal section and the third terminal section in their termination directions, respectively; and
a distance d1 in a y direction between a midpoint of the second reference line and a midpoint of the first reference line is different from a distance d2 in the y direction between the midpoint of the second reference line and a midpoint of the third reference line.

7. The electronic module according to claim 1, wherein in the first driving circuit board, a termination direction of the second terminal section is a y direction which crosses the x direction, and a termination direction of the first terminal section and a termination direction of the third terminal section are both a −y direction; and
in the second driving circuit board, the termination direction of the second terminal section is the y direction which crosses the x direction, and the termination direction of the first terminal section and the termination direction of the third terminal section are both the y direction.

8. The electronic module according to claim 7, wherein in each of the first driving circuit board and the second driving circuit board:
a first reference line, a second reference line and a third reference line are defined along edges of the first terminal section, the second terminal section and the third terminal section in their termination directions, respectively; and
a distance d1 in the y direction between a midpoint of the second reference line and a midpoint of the first reference line is equal to a distance d2 in the y direction between the midpoint of the second reference line and a midpoint of the third reference line.

9. The electronic module according to claim 7, wherein in each of the first driving circuit board and the second driving circuit board, the first terminal section and the third terminal section are axisymmetric with each other about a center line therebetween that is parallel to the y direction.

10. The electronic module according to claim 1, wherein in each of the first driving circuit board and the second driving circuit board:
  the substrate includes a recessed portion and a protruding portion having sides parallel to a y direction which crosses the x direction along an edge of the substrate where the first terminal section is provided, and includes a recessed portion and a protruding portion having sides parallel to the y direction which crosses the x direction along an edge of the substrate where the third terminal section is provided;
  each of the plurality of first terminals and the plurality of third terminals includes a plurality of terminals that are arranged along the sides of the recessed portion and the protruding portion parallel to the y direction;
  a termination direction of the first terminal section is the x or −x direction, and a termination direction of the third terminal section is also the x or −x direction; and a termination direction of the second terminal section is the y direction.

11. The electronic module according to claim 10, wherein the protruding portion along the edge where the third terminal section is provided in the first driving circuit board is arranged so that the protruding portion can be fitted in the recessed portion along the edge where the first terminal section is provided in the second driving circuit board.

12. The electronic module according to claim 1, wherein the plurality of third terminals of the first driving circuit board and the plurality of first terminals of the second driving circuit board are electrically connected to each other via one of ACF, ACP and NCP provided on the plurality of substrate terminals.

13. The electronic module according to claim 1, wherein a distance between the third terminal of the first driving circuit board and the first terminal of the second driving circuit board on the substrate terminal is about 4 mm or less.

14. The electronic module according to claim 1, wherein a connection resistance between the third terminal of the first driving circuit board and the first terminal of the second driving circuit board is about 5 Ω or less.

15. The electronic module according to claim 1, wherein a first group of the plurality of first terminals and a first group of the plurality of third terminals are arranged in the x direction and a second group of the plurality of first terminals and a second group of the plurality of third terminals are arranged in the y direction which crosses the x direction.

16. The electronic module according to claim 1, wherein the first and second driving circuit boards are source COFs.

17. The electronic module according to claim 1, wherein the first and second driving circuit boards are one of a COF and TCP.

18. The electronic module according to claim 1, wherein each of the first and second driving circuit boards includes at least two driving circuits.

19. A display device comprising the electronic module according to claim 1.

20. A driving circuit board, comprising:
  a substrate; and
  a driving circuit including a plurality of input terminals and a plurality of output terminals, a first terminal section, a second terminal section, a third terminal section, and a plurality of lines, which are provided on the substrate; wherein
  the plurality of lines connect the first terminal section and the third terminal section to each other, and are connected to the plurality of input terminals of the driving circuit;
  the first terminal section, the second terminal section and the third terminal section are arranged in this order in an x direction along the substrate;
  the first terminal section, the second terminal section and the third terminal section include a plurality of first terminals, a plurality of second terminals and a plurality of third terminals, respectively, which are arranged along the x direction;
  the plurality of second terminals are connected to the plurality of output terminals of the driving circuit;
  a termination direction of the second terminal section is a y direction which crosses the x direction; and
  one of a termination direction of the first terminal section and a termination direction of the third terminal section is the y direction while the other of the termination direction of the first terminal section and the termination direction of the third terminal section is a −y direction.

21. The driving circuit board according to claim 20, wherein a first reference line, a second reference line and a third reference line are defined along edges of the first terminal section, the second terminal section and the third terminal section in the respective termination directions; and a distance d1 in the y direction between a midpoint of the second reference line and a midpoint of the first reference line is different from a distance d2 in the y direction between the midpoint of the second reference line and a midpoint of the third reference line.

22. The driving circuit board according to claim 21, wherein an absolute value of a difference Δd between the distance d1 and the distance d2 is about 0.5 mm or less.

23. The driving circuit board according to claim 20, wherein the plurality of first terminals of the first terminal section are all arranged in the x direction, and the plurality of third terminals of the third terminal section are all arranged in the x direction.

24. The driving circuit board according to claim 20, wherein a first group of the plurality of first terminals and a first group of the plurality of third terminals are arranged in the x direction and a second group of the plurality of first terminals and a second group of the plurality of third terminals are arranged in the y direction which crosses the x direction.

25. The driving circuit board according to claim 20, wherein the driving circuit board is a source COF.

26. The driving circuit board according to claim 20, wherein the driving circuit board is one of a COF and TCP.

27. The driving circuit board according to claim 20, wherein at least two driving circuits are provided on the substrate.

28. A display device comprising the driving circuit board according to claim 20.

29. A driving circuit board, comprising:
  a substrate; and
  a driving circuit including a plurality of input terminals and a plurality of output terminals, a first terminal section, a second terminal section, a third terminal section, and a plurality of lines, which are provided on the substrate; wherein
  the plurality of lines connect the first terminal section and the third terminal section to each other, and are connected to the plurality of input terminals of the driving circuit;
  the first terminal section, the second terminal section and the third terminal section are arranged in this order along an x direction on the substrate;
  the first terminal section, the second terminal section and the third terminal section include a plurality of first terminals, a plurality of second terminals and a plurality of third terminals, respectively, which are arranged along the x direction;

the plurality of second terminals are connected to the plurality of output terminals of the driving circuit;

a termination direction of the first terminal section, a termination direction of the second terminal section and a termination direction of the third terminal section are all a y direction which crosses the x direction;

a first reference line, a second reference line and a third reference line are defined along edges of the first terminal section, the second terminal section and the third terminal section in the respective termination directions; and a distance d1 in the y direction between a midpoint of the second reference line and a midpoint of the first reference line is different from a distance d2 in the y direction between the midpoint of the second reference line and a midpoint of the third reference line.

30. The driving circuit board according to claim 29, wherein the second reference line and the first reference line are collinear with each other extending in the x direction, and the distance d1 is zero.

31. The driving circuit board according to claim 29, wherein an absolute value of a difference Δd between the distance d1 and the distance d2 is about 0.5 mm or less.

32. The driving circuit board according to claim 29, wherein the plurality of first terminals of the first terminal section are all arranged in the x direction, and the plurality of third terminals of the third terminal section are all arranged in the x direction.

33. The driving circuit board according to claim 29, wherein a first group of the plurality of first terminals and a first group of the plurality of third terminals are arranged in the x direction and a second group of the plurality of first terminals and a second group of the plurality of third terminals are arranged in the y direction which crosses the x direction.

34. The driving circuit board according to claim 29, wherein the driving circuit board is a source COF.

35. The driving circuit board according to claim 29, wherein the driving circuit board is one of a COF and TCP.

36. The driving circuit board according to claim 29, wherein at least two driving circuits are provided on the substrate.

37. A display device comprising the driving circuit board according to claim 29.

38. A driving circuit board, comprising:
a substrate; and
a driving circuit including a plurality of input terminals and a plurality of output terminals, a first terminal section, a second terminal section, a third terminal section, and a plurality of lines, which are provided on the substrate; wherein
the plurality of lines connect the first terminal section and the third terminal section to each other, and are connected to the plurality of input terminals of the driving circuit;
the first terminal section, the second terminal section and the third terminal section are arranged in this order along an x direction on the substrate;
the first terminal section, the second terminal section and the third terminal section include a plurality of first terminals, a plurality of second terminals and a plurality of third terminals, respectively;
the plurality of second terminals are connected to the plurality of output terminals of the driving circuit;

the substrate includes a recessed portion and a protruding portion having sides parallel to a y direction which crosses the x direction along an edge of the substrate where the first terminal section is provided, and includes a recessed portion and a protruding portion having sides parallel to the y direction along an edge of the substrate where the third terminal section is provided;

each of the plurality of first terminals, the plurality of second terminals and the plurality of third terminals includes at least two terminals that are arranged in the x direction, and each of the plurality of first terminals and the plurality of third terminals includes at least two terminals that are arranged along the sides of the recessed portion and the protruding portion parallel to the y direction;

a termination direction of the first terminal section is the x or −x direction, a termination direction of the third terminal section is the x or −x direction, and a termination direction of the second terminal section is the y direction.

39. The driving circuit board according to claim 38, wherein the protruding portion along the edge where the first terminal section is provided has such a shape that the protruding portion can be fitted in the recessed portion along the edge where the third terminal section is provided, and the protruding portion along the edge where the third terminal section is provided has such a shape that the protruding portion can be fitted in the recessed portion along the edge where the first terminal section is provided.

40. The driving circuit board according to claim 38, wherein the first terminal section and the third terminal section are axisymmetric with each other about a center line therebetween that is parallel to the y direction.

41. The driving circuit board according to claim 38, wherein the plurality of lines are provided between the driving circuit and the substrate.

42. The driving circuit board according to claim 38, wherein the plurality of lines cross over one another on the substrate.

43. The driving circuit board according to claim 38, wherein a first group of the plurality of first terminals and a first group of the plurality of third terminals are arranged in the x direction and a second group of the plurality of first terminals and a second group of the plurality of third terminals are arranged in the y direction which crosses the x direction.

44. The driving circuit board according to claim 38, wherein the driving circuit board is a source COF.

45. The driving circuit board according to claim 38, wherein the driving circuit board is one of a COF and TCP.

46. The driving circuit board according to claim 38, wherein at least two driving circuits are provided on the substrate.

47. A display device comprising the driving circuit board according to claim 38.

48. A pair of boards comprising a first driving circuit board and a second driving circuit board, each of the first and second driving circuit boards including:
a substrate; and
a driving circuit including a plurality of input terminals and a plurality of output terminals, a first terminal section, a second terminal section, a third terminal section, and a plurality of lines, which are provided on the substrate, wherein in each of the first driving circuit board and the second driving circuit board:

the plurality of lines connect the first terminal section and the third terminal section to each other, and are connected to the plurality of input terminals of the driving circuit;

the first terminal section, the second terminal section and the third terminal section are arranged in this order along an x direction on the substrate;

the first terminal section, the second terminal section and the third terminal section include a plurality of first terminals, a plurality of second terminals and a plurality of third terminals, respectively, which are arranged along the x direction; and the plurality of second terminals are connected to the plurality of output terminals of the driving circuit; wherein in the first driving circuit board, a termination direction of the second terminal section is a y direction which crosses the x direction, and a termination direction of the first terminal section and a termination direction of the third terminal section are both a −y direction; and in the second driving circuit board, the termination direction of the first terminal section, the termination direction of the second terminal section and the termination direction of the third terminal section are all the y direction.

49. The pair of driving circuit boards according to claim 48, wherein in each of the first driving circuit board and the second driving circuit board:

a first reference line, a second reference line and a third reference line are defined along edges of the first terminal section, the second terminal section and the third terminal section in the respective termination directions; and a distance d1 in the y direction between a midpoint of the second reference line and a midpoint of the first reference line is equal to a distance d2 in the y direction between the midpoint of the second reference line and a midpoint of the third reference line.

50. The pair of driving circuit boards according to claim 49, wherein an absolute value of a difference Δd between the distance d1 and the distance d2 is about 0.5 mm or less.

51. The pair of driving circuit boards according to claim 48, wherein the plurality of first terminals of the first terminal section are all arranged in the x direction, and the plurality of third terminals of the third terminal section are all arranged in the x direction.

52. The pair of driving circuit boards according to claim 48, wherein each of the pair of driving circuit board is a source COF.

53. The pair of driving circuit boards according to claim 48, wherein each of the pair of driving circuit boards is one of a COF and TCP.

54. A display device comprising the pair of driving circuit boards according to claim 48.

55. The pair of driving circuit boards according to claim 48, wherein in each of the first driving circuit board and the second driving circuit board, the first terminal section and the third terminal section are axisymmetric with each other about a center line therebetween that is parallel to the y direction.

56. An electronic module, comprising:

an electronic circuit substrate including a plurality of circuit components, a plurality of signal lines connected respectively to the plurality of circuit components, and a plurality of substrate terminals provided in a terminal region of the electronic circuit substrate; and a first driving circuit board, a second driving circuit board, a first wiring board and a second wiring board attached to the terminal region of the electronic circuit substrate while being arranged in an x direction; wherein each of the first and second driving circuit boards includes a first substrate, a driving circuit provided on the first substrate and including a plurality of input terminals and a plurality of output terminals, and an output line terminal section;

each of the first and second wiring boards includes a second substrate, an up-stream terminal section and a downstream terminal section provided on the second substrate, and a plurality of transfer lines connecting the upstream terminal section and the downstream terminal section to each other;

the upstream terminal section, the output line terminal section and the down-stream terminal section include a plurality of upstream terminals, a plurality of output line terminals and a plurality of downstream terminals, respectively;

the upstream terminal section, the output line terminal section and the down-stream terminal section are arranged in this order along the x direction;

the output terminals of the driving circuit of each of the first driving circuit board and the second driving circuit board are electrically connected to the signal lines of the electronic circuit substrate via the output line terminals;

the transfer lines of the first wiring board are electrically connected to the input terminals of the driving circuit of the second driving circuit board;

the downstream terminal section of the first wiring board and the upstream terminal section of the second wiring board are electrically connected to each other by only the substrate terminals provided on the electronic circuit substrate.

57. The electronic module according to claim 56, wherein a connection resistance between the downstream terminals of the first wiring board and the upstream terminals of the second wiring board is about 10 Ω or less.

58. The electronic module according to claim 56, wherein each of the plurality of up-stream terminals, the plurality of output line terminals and the plurality of downstream terminals includes at least two terminals that are arranged along the x direction.

59. The electronic module according to claim 56, wherein the first substrate of the first driving circuit board and the second substrate of the first wiring board are physically separate from each other, and the first substrate of the second driving circuit board and the second substrate of the second wiring board are physically separate from each other.

60. The electronic module according to claim 59, wherein:

the electronic circuit substrate includes a plurality of substrate lines electrically connected to the substrate terminals; and the downstream terminals of the first wiring board are electrically connected to the input terminals of the second driving circuit board via the substrate lines.

61. The electronic module according to claim 56, wherein the first substrate of the first driving circuit board and the second substrate of the first wiring board define an integral substrate, and the first substrate of the second driving circuit board and the second substrate of the second wiring board define an integral substrate.

62. The electronic module according to claim 61, wherein the transfer lines of the first wiring board are electrically connected to the input terminals of the driving circuit of the first driving circuit board between the upstream terminal section and the downstream terminal section.

63. The electronic module according to claim 56, wherein a first group of the plurality of upstream terminals and a first group of the plurality of downstream terminals are arranged in the x direction which crosses the y direction and a second group of the plurality of upstream terminals and a second group of the plurality of downstream terminals are arranged in the y direction which crosses the x direction.

64. The electronic module according to claim 56, wherein the first and second driving circuit boards are source COFs.

65. The electronic module according to claim 56, wherein the first and second driving circuit boards are one of a COF and TCP.

66. A display device comprising the electronic module according to claim 56.

67. An electronic module, comprising:
- an electronic circuit substrate including a plurality of circuit components, a plurality of signal lines connected respectively to the plurality of circuit components, and a plurality of substrate terminals provided in a terminal region of the electronic circuit substrate; and
- a first driving circuit board, a second driving circuit board, a first wiring board and a second wiring board attached to the terminal region of the electronic circuit substrate while being arranged along an x direction, wherein:
- each of the first and second driving circuit boards includes a first substrate, a driving circuit provided on the first substrate and including a plurality of input terminals and a plurality of output terminals, and an output line terminal section;
- each of the first and second wiring boards includes a second substrate, an up-stream terminal section and a down-stream terminal section provided on the second substrate, and a plurality of transfer lines connecting the upstream terminal section and the downstream terminal section to each other;
- the upstream terminal section, the output line terminal section and the down-stream terminal section include a plurality of upstream terminals, a plurality of output line terminals and a plurality of downstream terminals, respectively;
- the upstream terminal section, the output line terminal section and the down-stream terminal section are arranged in this order along the x direction;
- the output terminals of the driving circuit of each of the first driving circuit board and the second driving circuit board are electrically connected to the signal lines of the electronic circuit substrate via the output line terminals;
- the transfer lines of the first wiring board are electrically connected to the input terminals of the driving circuit of the second driving circuit board;
- the downstream terminal section of the first wiring board and the upstream terminal section of the second wiring board are electrically connected to each other by only the substrate terminals provided on the electronic circuit substrate, and
- each of the downstream terminals of the first wiring board corresponds to and faces a respective one of the upstream terminals of the second wiring board.

68. The electronic module according to claim 67, wherein a connection resistance between the downstream terminals of the first wiring board and the upstream terminals of the second wiring board is about 10 Ω or less.

69. The electronic module according to claim 67, wherein each of the plurality of up-stream terminals, the plurality of output line terminals and the plurality of downstream terminals includes at least two terminals that are arranged along the x direction.

70. The electronic module according to claim 67, wherein the first substrate of the first driving circuit board and the second substrate of the first wiring board are physically separate from each other, and the first substrate of the second driving circuit board and the second substrate of the second wiring board are physically separate from each other.

71. The electronic module according to claim 70, wherein:
- the electronic circuit substrate includes a plurality of substrate lines electrically connected to the substrate terminals; and
- the downstream terminals of the first wiring board are electrically connected to the input terminals of the second driving circuit board via the substrate lines.

72. The electronic module according to claim 67, wherein the first substrate of the first driving circuit board and the second substrate of the first wiring board define an integral substrate, and the first substrate of the second driving circuit board and the second substrate of the second wiring board define an integral substrate.

73. The electronic module according to claim 72, wherein the transfer lines of the first wiring board are electrically connected to the input terminals of the driving circuit of the first driving circuit board between the upstream terminal section and the downstream terminal section.

74. The electronic module according to claim 67, wherein a first group of the plurality of upstream terminals and a first group of the plurality of downstream terminals are arranged in the x direction which crosses the y direction and a second group of the plurality of upstream terminals and a second group of the plurality of downstream terminals are arranged in the y direction which crosses the x direction.

75. The electronic module according to claim 67, wherein the first and second driving circuit boards are source COFs.

76. The electronic module according to claim 67, wherein the first and second driving circuit boards are one of a COF and TCP.

77. A display device comprising the electronic module according to claim 67.

* * * * *